(12) United States Patent
Jang et al.

(10) Patent No.: US 9,392,735 B2
(45) Date of Patent: Jul. 12, 2016

(54) MAGNETIC FIELD SHIELDING SHEET FOR DIGITIZER AND METHOD OF MANUFACTURING THE SAME AND PORTABLE TERMINAL DEVICE USING THE SAME

(71) Applicant: AMOSENSE CO., LTD., Cheonan-si (KR)

(72) Inventors: Kil Jae Jang, Seongnam-si (KR); Dong Hoon Lee, Yongin-si (KR); Byoung Ki Lee, Gimpo-si (KR)

(73) Assignee: AMOSENSE CO., LTD. (KR)

( * ) Notice: Subject to any disclaimer, the term of this patent is extended or adjusted under 35 U.S.C. 154(b) by 123 days.

(21) Appl. No.: 14/405,502

(22) PCT Filed: Jun. 4, 2013

(86) PCT No.: PCT/KR2013/004919
§ 371 (c)(1),
(2) Date: Dec. 4, 2014

(87) PCT Pub. No.: WO2013/183913
PCT Pub. Date: Dec. 12, 2013

(65) Prior Publication Data
US 2015/0124402 A1    May 7, 2015

(30) Foreign Application Priority Data
Jun. 4, 2012    (KR) .................. 10-2012-0059902

(51) Int. Cl.
*H05K 9/00* (2006.01)
*B32B 27/08* (2006.01)
(Continued)

(52) U.S. Cl.
CPC ............. *H05K 9/0075* (2013.01); *B32B 7/12* (2013.01); *B32B 27/08* (2013.01); *B32B 27/281* (2013.01);
(Continued)

(58) Field of Classification Search
CPC .................................................. H05K 9/0075
See application file for complete search history.

(56) References Cited

U.S. PATENT DOCUMENTS

| | | | |
|---|---|---|---|
| 2014/0083758 A1* | 3/2014 | Park ................ | H05K 9/0081 174/391 |
| 2015/0123604 A1* | 5/2015 | Lee ................... | H01F 38/14 320/108 |

(Continued)

FOREIGN PATENT DOCUMENTS

| | | |
|---|---|---|
| JP | 63305600 | 12/1988 |
| JP | 06140783 | 5/1994 |

(Continued)

OTHER PUBLICATIONS

International Search Report—PCT/KR2013/004919 dated Aug. 28, 2013.

*Primary Examiner* — Hung V Ngo
(74) *Attorney, Agent, or Firm* — Cantor Colburn LLP

(57) ABSTRACT

A magnetic field shielding sheet includes: at least one layer thin magnetic sheet made of a Fe-based amorphous alloy and flake-treated so as to be separated into a plurality of fine pieces; a protective film that is adhered on one surface of the thin magnetic sheet via a first adhesive layer provided on one side of the protective film; and a double-sided tape that is adhered on the other surface of the thin magnetic sheet via a second adhesive layer provided on one side of the double-sided adhesive tape, wherein the thin magnetic sheet is obtained by heat treating an amorphous ribbon sheet made of the Fe-based amorphous alloy at a temperature of 300° C. to 480° C. A method of manufacturing the magnetic field shielding sheet, and a portable terminal device using the magnetic field shielding sheet are disclosed.

20 Claims, 14 Drawing Sheets

(51) Int. Cl.
B32B 37/12 (2006.01)
B32B 38/00 (2006.01)
C21D 6/00 (2006.01)
G06F 1/16 (2006.01)
G06F 1/18 (2006.01)
B32B 7/12 (2006.01)
B32B 27/28 (2006.01)
B32B 27/32 (2006.01)
B32B 27/36 (2006.01)
H01F 1/153 (2006.01)

(52) U.S. Cl.
CPC ................ *B32B 27/32* (2013.01); *B32B 27/36* (2013.01); *B32B 37/12* (2013.01); *B32B 38/00* (2013.01); *B32B 38/0036* (2013.01); *C21D 6/00* (2013.01); *G06F 1/1643* (2013.01); *G06F 1/182* (2013.01); *H01F 1/15308* (2013.01); *B32B 2307/208* (2013.01); *B32B 2307/212* (2013.01); *B32B 2307/702* (2013.01); *B32B 2307/748* (2013.01); *B32B 2309/02* (2013.01); *B32B 2309/04* (2013.01); *B32B 2309/105* (2013.01); *B32B 2457/00* (2013.01)

(56) References Cited

U.S. PATENT DOCUMENTS

| | | | |
|---|---|---|---|
| 2016/0064814 A1* | 3/2016 | Jang | H01Q 1/526 343/842 |
| 2016/0081238 A1* | 3/2016 | Lee | H01F 38/14 307/91 |
| 2016/0081240 A1* | 3/2016 | Lee | H01F 38/14 307/91 |

FOREIGN PATENT DOCUMENTS

| | | |
|---|---|---|
| JP | 08031237 | 2/1996 |
| JP | 2003045708 | 2/2003 |
| JP | 2005005286 | 1/2005 |
| KR | 1020030086122 | 11/2003 |
| KR | 1020050037015 | 4/2005 |
| KR | 1020110092833 | 8/2011 |

\* cited by examiner

MAGNETIC FIELD SHIELDING SHEET FOR DIGITIZER AND METHOD OF MANUFACTURING THE SAME AND PORTABLE TERMINAL DEVICE USING THE SAME

TECHNICAL FIELD

The present invention relates to a magnetic field shielding sheet for a digitizer, a method of manufacturing the magnetic field shielding sheet, and a portable terminal device using the magnetic field shielding sheet, and more particularly to, a magnetic field shielding sheet for a digitizer, which shields an effect of a magnetic field generated from various components of a main body of the portable terminal device and at the same time improves the sensitivity of a digitizer function when the digitizer function is implemented in the portable terminal device, while minimizing an influence upon a geomagnetic sensor, a method of manufacturing the magnetic field shielding sheet, and a portable terminal device using the magnetic field shielding sheet.

BACKGROUND ART

In recent years, portable terminal devices such as smart phones with a digitizer, that is, a pen tablet function, have been commercialized and become popular in the market. The digitizer enables a user to draw a line of about 0.7 mm thick with a pen, and thus is more precise than a capacitive type touch panel recognizing a line of 3-4 mm thick, to thereby perform a fine work easily.

In addition, it is possible to take handwritten notes, to draw a picture, and edit an image or photo, by using a digitizer. Furthermore, pressure of a force applied to the pen is detected when a user holds the electronic pen in hand to write a letter and thus thickness of the letter varies depending on the detected force, to thereby enable a work with a high resolution.

To implement such a tablet function, a digitizer panel is provided at a lower side of a touch screen/display panel. In addition, since the digitizer panel is formed of a thin metal film, a feeble electromagnetic field is created when the digitizer panel conducts electricity, and since a built-in ultra-small metal coil is provided at the end of the portable wireless electronic pen, an alternating magnetic field is generated in use.

Thus, when the tip of the electronic pen is close to the touch screen, the electromagnetic induction phenomenon occurs, while deformation of the electromagnetic field that has already been formed occurs on the digitizer panel disposed below the touch screen/display panel. Here, deformation of the electromagnetic field is detected through a sensor arranged at a side edge of the digitizer panel to thereby be interpreted as the actual movement of the electronic pen.

This tablet function is being applied to a large screen tablet personal computer (PC) employing a large display as well as a small portable terminal device such as a smart phone.

In order to use a wireless electronic pen function using an electromagnetic induction phenomenon in a portable terminal device, a magnetic field shielding sheet for shielding an electromagnetic field generated from various components of a main body of the portable terminal device, is inserted and used between the digitizer panel and a main circuit board. The main body of the portable terminal device has a variety of communication chips and antennas and generates an electromagnetic field for wireless communications.

Recently, a spread of a long-term evolution (LTE) implementing a fourth generation mobile communication technology uses radio waves much stronger than a conventional wireless communication terminal using the 3G mobile communication system. Accordingly, an influence upon a digitizer panel from the strong electromagnetic field is precluded, and a reliable magnetic field shield is required for smooth magnetic field communications between the electronic pen and the digitizer panel.

Meanwhile, the portable terminal device includes a geomagnetic sensor in order to implement functions such as navigation or augmented reality by using GPS (Global Positioning System) technologies. In addition, in the case of smart phones employing the Android operating system (OS), it is an essential condition to adopt the geomagnetic sensor.

Since the magnetic field shielding sheet is formed of a size corresponding to a digitizer, i.e., a display, in order not to influence upon an electronic pen function, it is difficult to design a gap between the magnetic field shielding sheet and the geomagnetic sensor in the inside of the portable terminal device to become 2 mm or longer.

However, in the case that the magnetic field shielding sheet is used in the portable terminal device in the proximity of and together with the geomagnetic sensor, the magnetic field shielding sheet affects the geomagnetic sensor thereby causing the malfunction in the geomagnetic sensor.

In other words, the geomagnetic sensor may cause azimuth distortion, sensor sensitivity distortion, and magnetic hysteresis distortion by the magnetic field shielding sheet.

The azimuth distortion means a phenomenon of distorting direction of the magnetic north due to the magnetic field shielding sheet, the sensor sensitivity distortion means a phenomenon of distorting sensitivity among X-, Y-, Z-axis sensors constituting the geomagnetic sensor, since the strength of the magnetic field is also changing due to the magnetic field shielding sheet, and the magnetic hysteresis distortion means a phenomenon of making an error in the azimuth depending on the direction of rotation of a portable terminal device in which a geomagnetic sensor is mounted, because of the magnetic hysteresis of a magnetic substance.

Accordingly, in order to prevent the distortion of the geomagnetic sensor and in order to measure accurate azimuth, it is necessary to correct the geomagnetic sensor. However, it is possible to correct the azimuth distortion and the sensor sensitivity distortion accurately, through signal processing, but since it is difficult to correct the magnetic hysteresis distortion accurately, through signal processing, an error of the azimuth may exist according to the malfunction of the geomagnetic sensor.

It is general to use a magnetic substance such as Fe-based and Co-based amorphous ribbons, ferrite sheets, or polymer sheets containing magnetic powder, as the magnetic field shielding sheet. A magnetic field focusing effect to improve performance of a magnetic field shielding function and an electronic pen function, may be good in the order of high permeability Fe-based and Co-based amorphous ribbons, ferrite sheets, and polymer sheets containing magnetic powder.

The Fe-based and Co-based amorphous ribbons are metal sheets in themselves, and thus, have no burden to the thickness. However, the Fe-based and Co-based amorphous ribbons have too large magnetic permeability, and thus affect the geomagnetic sensor. As a result, the Fe-based and Co-based amorphous ribbons are not used as the magnetic field shielding sheets. In addition, the ferrite sheets also have too large permeability and thus affect the geomagnetic sensor. In addition, the ferrite sheets also have drawbacks of getting thicker.

Thus, the conventional magnetic field shielding sheet employs a polymer sheet containing magnetic powder of a relatively poor magnetic permeability. However, when compared with the Fe-based and Co-based amorphous ribbons, the polymer sheet has low magnetic permeability, to thereby cause a problem that a digitizer is very expensive, together with a problem that sensitivity of the digitizer is degraded to the half (½). However, the polymer sheet does not affect the geomagnetic sensor due to the low magnetic permeability, and thus is employed for a digitizer.

In addition, the polymer sheet containing magnetic powder has low magnetic permeability, when compared with the Fe-based and Co-based amorphous ribbons. In the case of increasing thickness of the sheet in order to improve the performance of the low magnetic permeability, the polymer sheet gets thick in comparison with the Fe-based and Co-based amorphous ribbons that are thin plates of several tens of micrometers (μm), together with a problem that the material cost is further increased due to an increase of the thickness. Accordingly, it is difficult to cope with the trend that the terminals get thin.

Korean Patent Laid-open Publication No. 10-2005-37015 discloses a metal and polymer composite having a low frequency magnetic field shielding function, wherein at least one selected from Permalloy®, Sendust®, and a rapidly solidified alloy that are metal alloys having the low frequency magnetic field shielding function is included by 10 to 80 wt % in a powdered, flaky or fibrous form; a soft polymer material is included by 15 to 65 wt % as a matrix where the metal alloys are dispersed; and various additives are included by 5 to 25 wt % in order to be used to mix the metal alloys and the soft polymer material.

The sheet proposed in Korean Patent Laid-open Publication No. 10-2005-37015 has a problem of low permeability when being used as a magnetic field shielding sheet for a digitizer, as a kind of a polymer sheet.

Meanwhile, Korean Patent Laid-open Publication No. 10-2011-92833 proposed an electromagnetic wave absorbing sheet containing a Fe-based nanocrystalline soft magnetic powder and a carbon-based conductive material powder. The Fe-based nanocrystalline soft magnetic powder is formed of a Fe—Si—B—Nb—Cu-based alloy as an amorphous alloy. The Fe—Si—B—Nb—Cu-based alloy is preliminarily heat treated at a temperature of 350° C. to 500° C. for 45-90 minutes, to thus obtain alloy powders, the alloy powders are primarily and secondarily crushed, and then the crushed powders are meshed to be 270 mesh or less in particle size, to thereby obtain Fe-based nanocrystalline soft magnetic powders having nano-sized crystal grains.

The electromagnetic wave absorbing sheet is made to have a thickness of 0.5 mm, to thus absorb 10 MHz to 10 GHz band electromagnetic waves.

However, the electromagnetic wave absorbing sheet is simply used to absorb the high frequency band electromagnetic waves, and employs a kind of the polymer sheet that is made to have a thickness of 0.5 mm by mixing a Fe-based nanocrystalline soft magnetic powder having nano-sized crystal grains, with a binder. As a result, the electromagnetic wave absorbing sheet gets thick when compared with the case of using an amorphous ribbon sheet (whose thickness is about 0.06 mm or less), and also has the low permeability due to the mixture of the binder.

Korean Patent Laid-open Publication No. 10-2003-86122 discloses a method of manufacturing an electromagnetic wave shielding material by using a metal foil ribbon of high magnetic permeability, the method including: preparing a metal foil ribbon in the range of 1 μm to 900 μm thick, and in the range of 1 mm to 90 mm wide, with a metal or alloy having a specific permeability of 1000 or more and selected from Ni—Fe—Mo, Fe—Si, and mu-metal by performing a quenching solidification method; annealing the metal foil ribbon in a temperature range of 700° C. to 1300° C. and under a hydrogen or vacuum atmosphere; and forming an adhesive layer on at least one surface of the metal foil ribbon.

Further, the electromagnetic wave shielding material manufacturing method further comprises forming a thin film layer of Cu, Ni, Ag, Al, Au, and Sn or a combination of these metals on at least one surface of the metal foil ribbon by electroplating or vacuum deposition.

However, the electromagnetic wave shielding material manufactured according to the Korean Patent Laid-open Publication No. 10-2003-86122 is not applicable to the magnetic shield sheet for a digitizer due to high magnetic permeability.

The aforementioned prior art discloses an electromagnetic wave absorbing sheet or a magnetic field shielding sheet. However, when both a digitizer function and a navigation function are implemented in a portable terminal device such as a smart phone, the above-described conventional magnetic field shielding sheet made of a Sendust® sheet or a heatless treatment Fe-based amorphous ribbon sheet does not propose a possible solution to the problems that sensitivity of the digitizer is low due to the low magnetic permeability, a distortion problem for the geomagnetic sensor is present due to too high magnetic permeability, or the material cost for the magnetic field shielding sheet is very expensive since the thickness of the magnetic field shielding sheet gets thick.

Taking into account that the distortion of the azimuth and the sensor sensitivity distortion among the distortions that occur in the geomagnetic sensor due to the magnetic field shielding sheet can be accurately corrected, but the directional distortion due to the magnetic hysteresis cannot be accurately corrected, the inventor(s) has tried to develop magnetic field shielding sheets that do not cause the magnetic hysteresis distortion problem. In addition, in the case that the Fe-based amorphous ribbon is heat treated to thus make low magnetic permeability, it is recognized that the geomagnetic sensor is not affected, which leads the inventor(s) to the present invention.

Meanwhile, the magnetic hysteresis means that a magnetic body has a hysteresis that magnetic induction values in the inside of the magnetic body do not match each other when a magnetic field is applied to the magnetic body through a rise and fall of the magnetic field, and the magnetic hysteresis may occur in the case that the magnetic field is applied to the magnetic body until the magnetic body is saturated. In the case that the magnetic field does not reach a saturation region, the magnetic induction values are repeatedly increased and decreased without causing any hysteresis along an initial magnetization curve.

In the case of the heatless treatment Fe-based amorphous ribbon, a value of a saturation field (Hs) that is the minimum magnetic field to obtain the saturation induction is about 0.4 G that is lower than the earth magnetic field having a value of about 0.5 G, in a magnetic hysteresis loop.

Therefore, the Fe-based amorphous ribbon sheet exhibits the magnetic hysteresis even in the case of the change in the earth magnetic field, with the result that a geomagnetic sensor used in a terminal to which a Fe-based amorphous ribbon sheet is applied, has a fatal disadvantage that even the magnetic hysteresis due to the Fe-based amorphous ribbon sheet should be corrected.

The present invention has been devised in consideration of facts that the magnetic hysteresis distortion problem can be blocked when the Fe-based amorphous alloy ribbon sheet is heat treated and flake treated to thereby increase a demagnetizing field so as not to form the magnetic saturation, the azimuth distortion and the sensor sensitivity distortion bearing on the geomagnetic sensor can be corrected by software, and the sensitivity of the electronic pen in the digitizer is preferable when the permeability of the shielding sheet is high.

Further, a nanocrystalline ribbon sheet having a nanocrystalline microstructure by a heat treatment exhibits a problem that uniformity of the permeability falls down in view of a whole sheet since the size of the nano-crystal grains in the heat treatment process fails to uniform, and such uniformity deterioration of the permeability may be a factor that degrades the uniformity of characteristics of a digitizer. On the contrary, if the Fe-based amorphous ribbon is heat treated below a crystallization temperature thereby having a tissue of an amorphous state, the characteristics of the tissue are uniform, and thus uniformity of the permeability is high in view of a whole sheet when compared with the nanocrystalline ribbon sheet having a large number of fine nanocrystalline structures, which led the inventor(s) to the present invention.

In general, in the case of the nanocrystalline ribbon sheet, it is known that it is difficult to prepare a ribbon of 50 mm or wider. Thus, when a magnetic field shielding sheet for a large-area digitizer of 50 mm or wider, it is difficult to secure the uniformity of the permeability in view of a whole sheet, since at least two sheets of the ribbons are butted or overlapped to cover a required large-area.

The conventional Fe-based amorphous ribbons have been used without passing through the heat treatment, or after undergoing the heat treatment. The main purpose of the heat treatment is to release the stress, through the magnetic field heat treatment for magnetic properties, for example, an increase in the permeability, a decrease in the core loss, or an increase in the saturation flux density, and through the embrittlement heat treatment for producing the powder, but the heat treatment of an object for reducing the permeability was not attempted.

DISCLOSURE

Technical Problem

To solve the above problems or defects, it is an object of the present invention to provide a magnetic field shielding sheet for a digitizer, and a manufacturing method thereof, in which the heat treatment of the Fe-based amorphous alloy ribbon sheet is superheated over a critical temperature, to thereby lower permeability of the magnetic field shielding sheet to optimal permeability, to thus prevent a geomagnetic sensor from being affected, and to accordingly shield an electromagnetic field generated from various components of a main body of a portable terminal device.

It is another object of the present invention to provide a magnetic field shielding sheet for a digitizer, and a manufacturing method thereof, in which an amorphous alloy ribbon sheet is heat treated at a temperature less than a crystallization temperature, to thereby reduce the permeability within a desired range, and is maintained in an amorphous state and flake-treated to then be separated into a number of fine pieces, to thus increase a demagnetizing field to remove a hysteresis loss, and to accordingly heighten the uniformity of the permeability to thereby implement a digitizer of uniform characteristics.

It is still another object of the present invention to provide a portable terminal device having a digitizer function, in which a Fe-based amorphous alloy ribbon sheet is heat treated and flake-treated, to thus increase a demagnetizing field to prevent magnetic saturation from being achieved, and to thus block a magnetic hysteresis distortion of a geomagnetic sensor, to simultaneously heighten the permeability of a shielding sheet, and to thus enhance an electronic pen sensitivity for a digitizer.

It is yet another object of the present invention to provide a magnetic field shielding sheet for a digitizer, and a manufacturing method thereof, with a simple manufacturing process, excellent productivity, and low manufacturing costs.

Technical Solution

To accomplish the above and other objects of the present invention, according to an aspect of the present invention, there is provided a magnetic field shielding sheet for a digitizer, comprising:

at least one layer thin magnetic sheet made of a Fe-based amorphous alloy and flake-treated so as to be separated into a plurality of fine pieces;

a protective film that is adhered on one surface of the thin magnetic sheet via a first adhesive layer provided on one side of the protective film; and a double-sided tape that is adhered on the other surface of the thin magnetic sheet via a second adhesive layer provided on one side of the double-sided adhesive tape, wherein the thin magnetic sheet is obtained by heat treating an amorphous ribbon sheet made of the Fe-based amorphous alloy at a temperature of 300° C. to 480° C.

According to another aspect of the present invention, there is provided a method of manufacturing a magnetic field shielding sheet for a digitizer, the method comprising the steps of:

heat treating a Fe-based amorphous ribbon sheet at a temperature of 300° C. to 480° C. for 30 minutes to 2 hours, to thereby form a thin magnetic sheet;

adhering a protective film and a double-sided tape formed of a release film on an exposed surface of the double-sided tape, respectively, on both sides of the thin magnetic sheet, to thereby form a laminate sheet;

performing a flake treatment process of the laminate sheet to thus separate the thin magnetic sheet into a plurality of fine pieces; and laminating the flake treated laminate sheet, wherein the laminate sheet is flattened and slimmed by lamination of the laminate sheet and some parts of first and second adhesive layers are filled into gaps among the plurality of fine pieces, to thereby isolate the plurality of fine pieces.

According to still another aspect of the present invention, there is provided a portable terminal device comprising a first magnetic filed shielding sheet that is inserted between a digitizer panel and a main circuit board to thus shield an alternating-current magnetic field generated from the main circuit board, wherein the first magnetic shielding sheet comprises:

at least one layer first thin magnetic sheet made of a Fe-based amorphous alloy and flake-treated so as to be separated into a plurality of fine pieces;

a protective film that is adhered on one surface of the first thin magnetic sheet via a first adhesive layer provided on one side of the protective film; and a double-sided tape that is adhered on the other surface of the first thin magnetic sheet via a second adhesive layer provided on one side of the double-sided adhesive tape, wherein the first thin magnetic sheet is obtained by heat treating an amorphous ribbon sheet made of the Fe-based amorphous alloy at a temperature of 300° C. to 480° C.

Advantageous Effects

As described above, the present invention increases a demagnetizing field to prevent magnetic saturation from being achieved, and blocks a magnetic hysteresis distortion of a geomagnetic sensor, to simultaneously heighten the permeability of a shielding sheet, and to thus enhance an electronic pen sensitivity for a digitizer, by heat treating a Fe-based amorphous alloy ribbon sheet and then performing a flake treatment process of the Fe-based amorphous alloy ribbon sheet.

In addition, the present invention performs superheating treatment at a temperature above a critical temperature, when a Fe-based amorphous alloy ribbon or strip is heat treated, in which the permeability of a shielding sheet is established to have optimal permeability to thus prevent a geomagnetic sensor from being affected, and to thus enhance sensitivity for a digitizer.

As a result, the magnetic field shielding sheet according to the present invention, replaces a polymer sheet that is expensive and has low magnetic permeability, or a Fe-based or Co-based amorphous ribbon sheet of high permeability that has the advantages of thickness and the magnetic characteristic of excellent permeability but generates a distortion in a magnetic hysteresis phenomenon in a geomagnetic sensor, to accordingly shield an electromagnetic field generated from various components of a main body of a portable terminal device, and to thus enhance sensitivity for a digitizer function.

The magnetic field shielding sheet according to the present invention is configured by heat treating an amorphous alloy ribbon under a non-magnetic field circumstance at a temperature less than a crystallization temperature, to thereby increasing the surface resistance of the amorphous alloy ribbon, lower the permeability down to a desired range, and maintain to be an amorphous state, by performing a flake treatment process of the amorphous alloy ribbon to then be separated into a plurality of fine pieces, to thereby increase a demagnetizing field, to thus remove a hysteresis loss, to accordingly increase uniformity of the permeability of the magnetic field shielding sheet, and to implement a digitizer of uniform characteristics, and by reducing a surface area of the amorphous alloy ribbon, to thereby increase a demagnetizing field so that magnetic saturation does not occur, and to thereby reduce losses due to an eddy current to thus minimize the heat generation.

According to the present invention, an amorphous alloy ribbon or strip is overheated to thus adjust permeability and to thus easily process a flake treatment simultaneously in a later process. Accordingly, magnetic field shielding sheets can be easily prepared.

In addition, according to the use of the Fe-based amorphous ribbon, a wide-width amorphous ribbon corresponding to an area of a display of a mobile terminal device, that is, a digitizer can be easily manufactured, to thereby eliminate local permeability variations that occur when one or more amorphous ribbon sheets are configured through overlapping or butting, and to thus achieve high productivity.

Since the magnetic field shielding sheet using the Fe-based amorphous ribbon according to the present invention is configured by performing a flake treatment process of the amorphous alloy ribbon to then be separated and/or cracked into a plurality of the fine pieces, the magnetic field is attenuated while passing through the plurality of the fine pieces even in the case that a magnetic field is applied from the outside along one side of the magnetic field shielding sheet, and thus is not nearly dissipated on the opposite side of the nanocrystalline ribbon sheet to which the magnetic field has been applied. As a result, the present invention has little effect on the geomagnetic sensor even in the case that a magnetic field is applied from the outside along one side of a Fe-based amorphous ribbon sheet, when the magnetic field shielding sheet having the Fe-based amorphous ribbon sheet is used in a portable terminal device.

Moreover, the present invention fills gaps between fine pieces of a Fe-based amorphous ribbon with an adhesive by performing a flake treatment process of the Fe-based amorphous ribbon and then by performing a compression laminating process, to thereby prevent water penetration, and simultaneously surround all surfaces of the fine pieces with the adhesive (or the dielectric), to thus mutually isolate the fine pieces, to thereby promote reduction of eddy currents, and to thereby prevent shielding performance from falling.

In addition, the present invention sequentially performs a flake treatment process and a laminating process by using a roll-to-roll method, to thereby achieve a sheet molding process, to thus maintain original thickness of the sheet, and to thus exhibit high productivity and inexpensive manufacturing costs.

Furthermore, according to the present invention, a manufacturing process is simple, to thereby achieve a high productivity and inexpensive manufacturing costs.

BEST MODE

The above and other objects, features, and advantages of the present invention can be appreciated by the following description and will be understood more clearly by embodiment of the present invention. In addition, it will be appreciated that the objects and advantages of the present invention will be easily realized by means shown in the appended patent claims, and combinations thereof. Accordingly, the technical spirit of the present invention can be easily implemented by one of ordinary skill in the art.

Further, if it is determined that the detailed description of the known art related to the present invention makes the gist of the present invention unnecessarily obscure, a detailed description thereof will be omitted.

Figure 1:
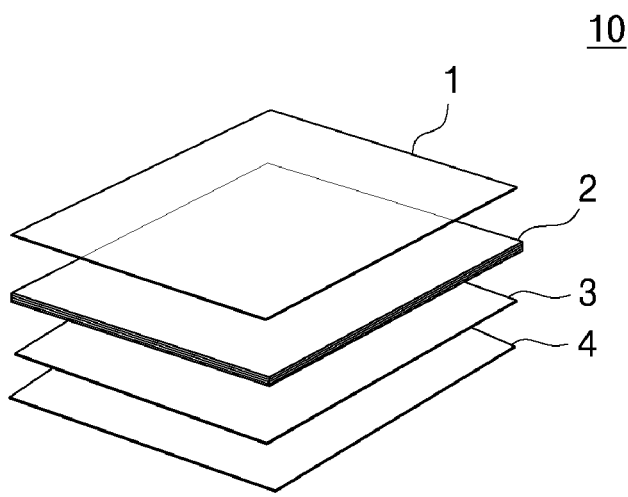
FIG. 1 is an exploded perspective view showing a magnetic field shielding sheet for a digitizer according to a preferred embodiment of the present invention.
Figure 2:
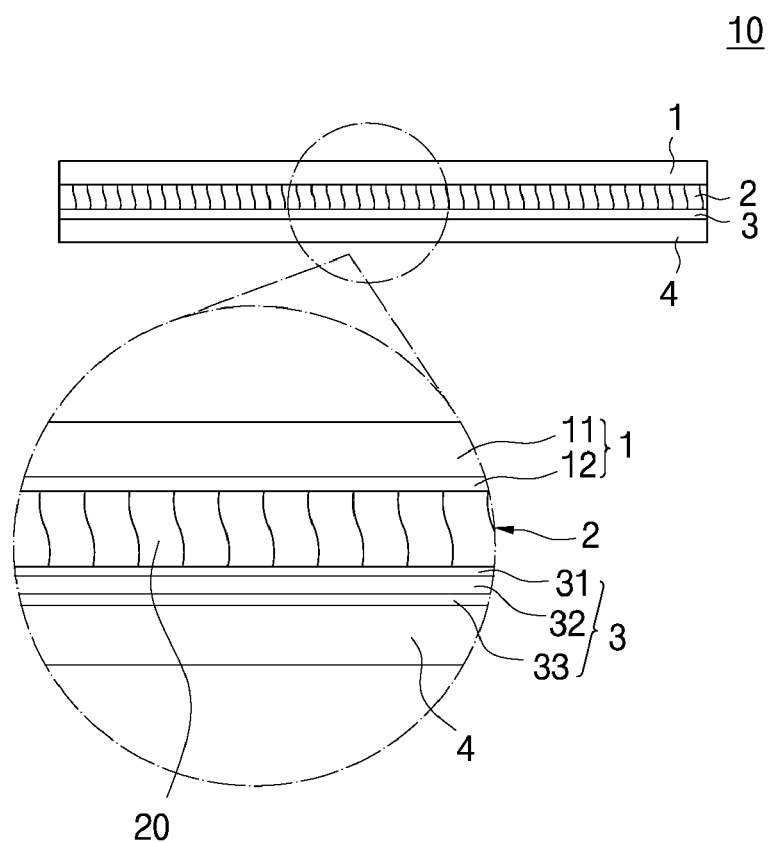
FIG. 2 is a cross-sectional view showing a first example of using a single Fe-based amorphous ribbon sheet in the FIG. 1 embodiment.
Figure 3:
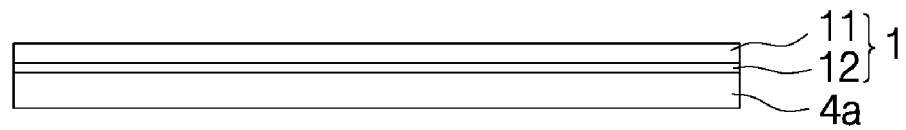
FIGS. 3 and 4 are cross-sectional views showing the structure of a protective film and a double-sided tape that are respectively used in the present invention.
Figure 4:
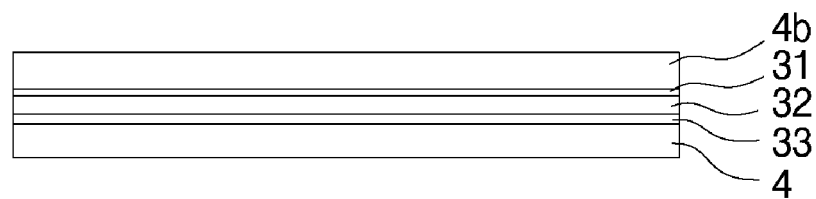
Figure 5:
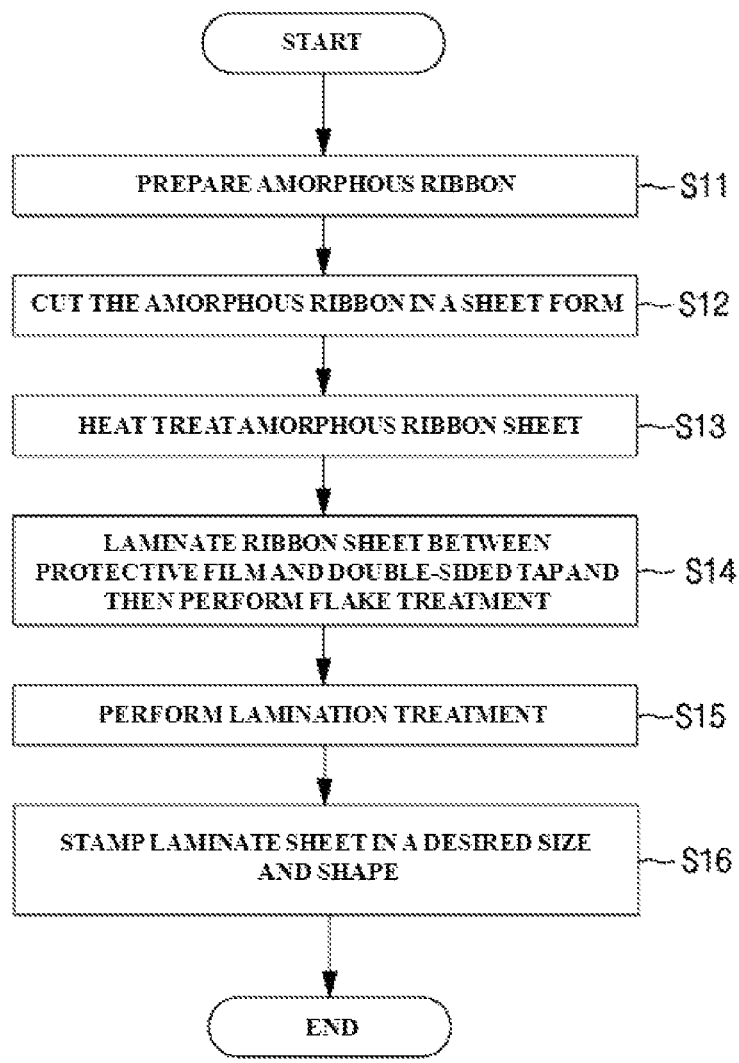
FIG. 5 is a flowchart view for describing a process of manufacturing a magnetic field shielding sheet according to the present invention.

FIG. 1 is an exploded perspective view showing a magnetic field shielding sheet for a digitizer according to a preferred embodiment of the present invention. FIG. 2 is a cross-sectional view showing a first example of using a single Fe-based amorphous ribbon sheet in the FIG. 1 embodiment. FIGS. 3 and 4 are cross-sectional views showing the structure of a protective film and a double-sided tape that are respectively used in the present invention. FIG. 5 is a flowchart view for describing a process of manufacturing a magnetic field shielding sheet according to the present invention.

Referring to FIGS. 1 to 4, a magnetic field shielding sheet 10 according to an embodiment of the present invention includes: a single-layer or double-layer amorphous ribbon sheet 2 that is formed by thermally treating an amorphous alloy ribbon or strip (hereinafter, simply called a "ribbon"), and then performing a flake treatment process to be separated and/or cracked into a plurality of fine pieces; a protective film 1 that is adhered on the upper portion of the amorphous ribbon sheet 2; a single-layer double-sided tape 3 that is adhered on the lower portion of the amorphous ribbon sheet 2; and a release film 4 that is adhered on the lower portion of the double-sided tape 3. The release film 4 is integrally formed during manufacturing the double-sided tape 3, and is removed when the magnetic field shielding sheet 10 is attached on a digitizer panel.

For example, the amorphous ribbon sheet 2 may be a thin plate ribbon made of a Fe-based magnetic alloy.

For example, the Fe-based magnetic alloy may be a Fe—Si—B alloy, and it is preferable that Fe should be in the range of 70-90 atomic %, and the sum of Si and B should be in the range of 10-30 atomic %. The higher the content of a metal including Fe, the higher a saturation magnetic flux density becomes, but if the content of Fe is excessive, it is difficult to form an amorphous state. Thus, in the present invention, it is preferable that the content of Fe should be in the range of 70-90 atomic %. In addition, an amorphous state forming ability of the alloy is the most excellent when the range of the sum of Si and B is in the range of 10-30 atomic %. In order to prevent corrosion, a corrosion-resistant element such as Cr may be also added to the basic composition within a few atomic %, and a small amount of other metal elements necessary to impart different properties may be included in the basic composition.

For example, the Fe—Si—B alloy whose crystallization temperature is 508° C. and whose Curie temperature (Tc) is 399° C. can be used in the present invention. However, the crystallization temperature may be varied depending on the content of Si and B, or the other metal elements and the content thereof to be added in addition to a ternary alloy composition.

As shown in FIG. 2, the magnetic field shielding sheet 10 according to the present invention has a structure in which a protective film 1 is adhered on one side of a single sheet of an amorphous ribbon sheet 2 and a double-sided tape 3 is adhered on the other side of the amorphous ribbon sheet 2, in which a release film 4 is adhered on the other surface of the double-sided tape 3.

Typically currently available Fe-based amorphous ribbons can be made into wide-width ribbon sheets of about 100 mm or wider. As a result, the magnetic field shielding sheet 10 according to the present invention can be applied even in the case of a large display whose area is larger than that of a smart phone, for example, a portable terminal device whose width is about 100 mm, in which two sheets are not used after being butted in the longitudinal direction, but a single sheet of a wide-width ribbon sheet can be cut to cover the magnetic field shielding sheet 10 for the portable terminal device whose width is 100 mm.

Thus, in the case of a nanocrystalline ribbon sheet that is formed by butting or overlapping two sheets typically having a width of 50 mm in the longitudinal direction, a variation in the permeability has encountered between the sheets or in the connecting portion of the sheets, and thus a digitizer causes a problem that it is difficult to indicate a uniform characteristic. However, the present invention using a single sheet of a wide-width ribbon sheet may eliminate such a local permeability variation.

As shown in FIG. 4, the protective film 1 may be implemented by using a substrate 11 including a polyethylene terephthalate (PET) film, a polyimide film, a polyester film, polyphenylene sulfade (PPS) film, a polypropylene (PP) film, or a fluorine resin-based film such as poly terephthalate (PTFE). A first adhesive layer 12 is attached to one side of the substrate 11. When the protection film 1 is attached on one side of the amorphous ribbon sheet 2, a release film 4a attached on the other surface of the first adhesive layer 12 to protect the first adhesive layer 12 is removed and then the protection film 1 is attached on one side of the amorphous ribbon sheet 2.

Further, as shown in FIG. 5, the double-sided tape 3 is formed of a substrate 32 made of a fluorine resin-based film, for example, a PET (Polyethylene Terephthalate) film, on both sides of which second and third adhesive layers 31 and 33 are formed. Release films 4 and 4b are attached on the outer surfaces of the second and third adhesive layers 31 and 33, respectively, in order to protect the second and third adhesive layers 31 and 33.

When the double-sided tape 3 is attached on the lower portion of the amorphous ribbon sheet 2, the double-sided tape 3 is used at a state where the release film 4b is peeled off and removed from the double-sided tape 3, and the release film 4 attached on the lower portion of the double-sided tape 3 is peeled off and removed from the double-sided tape 3 when the magnetic field shielding sheet 10 is attached to a digitizer panel.

The double-sided tape 3 may be a type of including a substrate as described above, but may be a type of including no substrate but being formed of only adhesive layers. In the case of the double-sided tape interposed between the amorphous ribbon sheets 2, it is preferable to use a non-substrate type double-sided tape in terms of a thinning process.

The second and third adhesive layers 31 and 33 that are used for the protective film 1 and the release film 4 may be implemented by using, for example, acrylic adhesives, but may be of course possibly implemented by using different types of adhesives.

Figure 16:
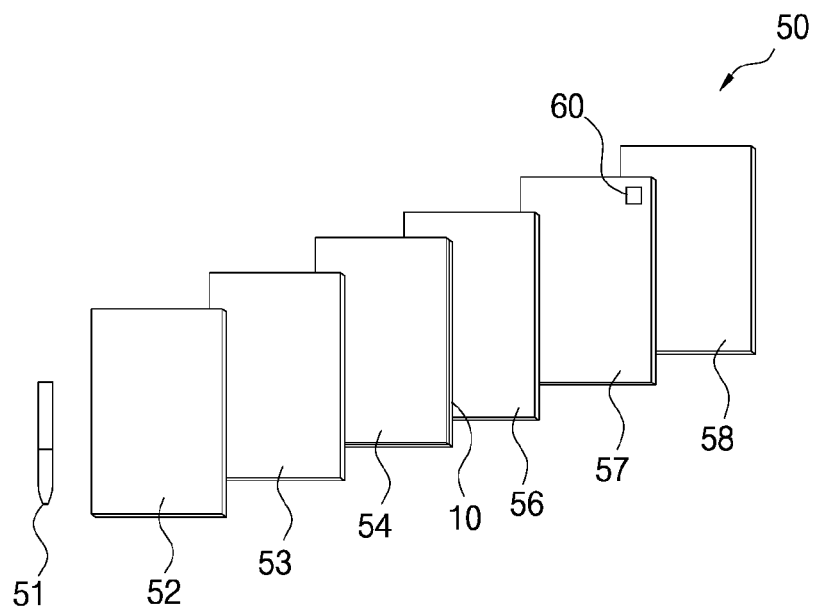
FIG. 16 is a schematic exploded perspective view of the structure that a magnetic field shielding sheet according to the present invention is applied to a portable terminal device having a digitizer function.

As shown in FIG. 1, the magnetic field shielding sheet 10 according to the embodiment of the present invention may be made into a rectangular shape in correspondence to a digitizer 54 of FIG. 16, and has preferably a shape corresponding to a shape of a portion required for shielding a magnetic field.

One piece of the amorphous ribbon sheet 2 that is used for the magnetic field shielding sheet 10 may have a thickness of 15 μm to 35 μm, for example. In this case, in consideration of a handling process after the heat treatment of the amorphous ribbon sheet 2, a thickness of the amorphous ribbon sheet 2 is preferably set to be in the range of 25 μm to 30 μm. The thinner the thickness of the ribbon may become, a breakage phenomenon of the ribbon may occur due to even a little shock at the time of performing a handling process after the heat treatment.

Further, the protective film 1 may have a thickness of a 10 μm to 30 μm range, and may preferably have a thickness of 10 μm. The double-sided tape 3 may have 10 μm, 20 μm, 30 μm thick, and may preferably have a thickness of 10 μm.

Hereinafter, a method of manufacturing a magnetic field shielding sheet 10 according to the embodiment of the present invention, will be described with reference to FIG. 5.

First, an ultra-thin amorphous ribbon equal to or less than 30 μm made of a Fe-based amorphous ribbon, e.g., a Fe—Si—B alloy is prepared by a rapidly solidification process (RSP) due to melt spinning (S11), and is cut in a predetermined length to then be laminated in a sheet form (S12) so that post-processing after a heat treatment can be easily performed.

A desired range of the permeability (inductance) of the amorphous ribbon sheet 2 in the present invention shall be set to have permeability that does not affect a geomagnetic sensor, and that shields a magnetic field generated from a main body of a portable terminal device so as not to affect a digitizer and so as to improve sensitivity of the digitizer at the same time.

As shown in FIG. 16, when a distance between a magnetic field shielding sheet 10 using a Fe-based amorphous ribbon sheet 2 and a geomagnetic sensor 60 is set to have about 2 mm, a range of permeability of the amorphous ribbon sheet 2 that does not affect at the time of measuring azimuth of the geomagnetic sensor 60 has been required to be in the range of 15 μH to 18 μH based on the inductance.

To meet these needs, the stacked ribbon sheets are heat-treated under a non-magnetic field circumstance for 30 minutes to 2 hours in a second temperature range ($T_o$) of 445° C. ($T_3$) to 460° C. ($T_4$), to thereby obtain an amorphous ribbon sheet 2 having a permeability value (an inductance value) in a 15 μH to 18 μH range (S13).

In this case, according to the heat treatment atmosphere, since the heat treatment is performed in a temperature range so that oxidation does not occur, even though the Fe content of the amorphous ribbon sheet 2 is high, the heat treatment is not necessary to be made in an atmosphere furnace, but it may be sufficient to perform the heat treatment in the air. Further, even if the heat treatment takes place in an oxidizing atmosphere or a nitrogen atmosphere, the permeability of the sheet is not substantially different at an identical temperature condition.

Figure 6:
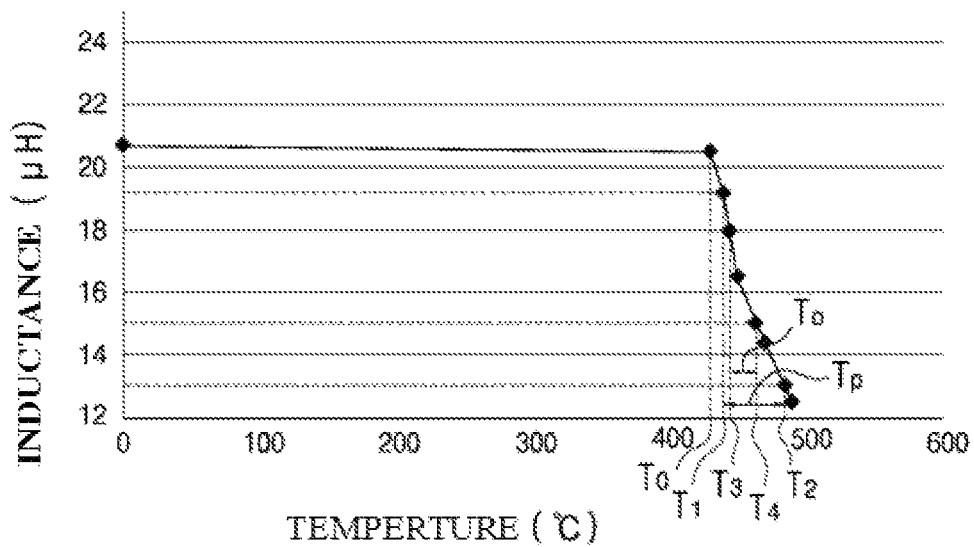
FIG. 6 is a graph illustrating the relationship between a heat treatment temperature and an inductance (permeability) of a Fe-based amorphous ribbon sheet that is used for a magnetic field shielding sheet according to the present invention.

As shown in FIG. 6, the Fe-based amorphous ribbon sheet 2 made of the Fe—Si—B alloy is maintained to have an inductance value of about 20.7 μH (Here, the permeability is proportional to the inductance value) when the heat treatment temperature is 430° C. ($T_o$) or less. As the heat treatment temperature increases from the starting point 430° C. ($T_o$), the surface resistance of the sheet increases while the partial crystallization is created. Accordingly, the inductance (the permeability) is reduced abruptly.

Therefore, the amorphous ribbon sheet 2 is obtained as follows. The Fe—Si—B alloy is made in an amorphous ribbon or strip form, and then heat-treated under a non-magnetic field circumstance for 30 minutes to 2 hours in a second temperature range ($T_o$) of 445° C. ($T_3$) to 460° C. ($T_4$), to thereby obtain an amorphous ribbon sheet 2 having a permeability value (an inductance value) in a 15 μH to 18 μH range through a method of reducing inductance (permeability).

The permeability of the sheet may be converted from an inductance value of an obtained sheet, for example, after measuring the inductance value of the sheet under the conditions of 100 kHz and 1V applied to an LCR meter, by using a coil of 12.1 μH.

In the case that the heat treatment temperature is less than 445° C. ($T_3$) so as to satisfy the range of the inductance (permeability), there is a problem of exhibiting permeability higher than desired permeability and consuming a long heat treatment time. In the case that the heat treatment temperature exceeds 460° C. ($T_4$), permeability is remarkably lowered through an overheating process, to thereby cause a problem of exhibiting desired permeability. In general, if the heat treatment temperature is low, it takes a long processing time, whereas if the heat treatment temperature is high, the process time tends to be shortened.

Meanwhile, the Fe-based amorphous ribbon sheet 2 according to the present invention has a thickness of a 15 μm to 35 μm range, and the permeability of the Fe-based amorphous ribbon sheet 2 is increased in proportion to the thickness of the ribbon.

Further, the amorphous ribbon is heat-treated according to non-uniformity of the raw material of the sheet, thickness of the sheet, and the internal environment of a heat treatment furnace, and the permeability of the amorphous ribbon sheet 2 can cause individual variations.

However, the heat treatment condition in the second temperature range $T_0$ for the Fe-based amorphous ribbon sheet 2 is the condition required for the case that a distance between the magnetic field shielding sheet 10 using the Fe-based amorphous ribbon sheet 2 and the geomagnetic sensor 60 is set to have an interval of about 2 mm.

As shown in FIG. 16, if the distance between the magnetic field shielding sheet 10 and the geomagnetic sensor 60 is set to be within 2 mm, permeability of the ribbon sheet 2 can be set to become lower, while if the distance between the magnetic field shielding sheet 10 and the geomagnetic sensor 60 is set to be greater than 2 mm, permeability of the ribbon sheet 2 can be also set to become higher.

Therefore, when considering the permeability in this wide range, the heat treatment condition in the Fe-based amorphous ribbon sheet 2 can be set to be 30 minutes to 2 hours at a first temperature range ($T_p$) of 440° C. ($T_1$) to 480° C. ($T_2$).

Further, if an overheating process is performed at a temperature between 430° C. and 500° C., a sheet having desired permeability can be easily produced by using a property in which the inductance value of the sheet is reduced substantially linearly.

Meanwhile, the range of the heat treatment temperature is to set the permeability of the ribbon sheet 2 to an appropriate range when being used without any software correction at the time of measuring the azimuth of the geomagnetic sensor 60, at a state where the distance between the magnetic field shielding sheet 10 and the geomagnetic sensor 60 is set to be less than 2 mm.

In the present invention, when the Fe-based amorphous alloy ribbon sheet is heat-treated and then flake-treated, to thereby increase the demagnetizing field, it was found that the magnetic saturation is prevented from being achieved and thus the magnetic hysteresis distortion of the geomagnetic sensor is blocked.

Accordingly, even if the magnetic permeability of the magnetic field shielding sheet exceeds the permeability value (inductance value) in the range of 18 µH, in the event that the magnetic hysteresis distortion does not occur in the geomagnetic sensor but only the azimuth distortion and the sensor sensitivity distortion occur, the azimuth distortion and the sensor sensitivity distortion can be corrected by software. Thus, as the ribbon sheet used for the magnetic field shielding sheet 10 has higher permeability, sensitivity of an electronic pen for a digitizer can be preferably improved.

In the event that the azimuth distortion and the sensor sensitivity distortion of the geomagnetic sensor 60 are calibrated by software, the distance between the magnetic field shielding sheet 10 and the geomagnetic sensor 60 is set larger than 2 mm, or the geomagnetic sensor 60 is not employed, it is also possible to adopt the ribbon sheet 2 of higher permeability.

In consideration of these points in the present invention, the lower limit of the heat treatment temperature for the Fe-based amorphous ribbon sheet 2 is set to 300° C. that is a temperature at which the flake treatment process of the amorphous ribbon sheet can be easily made at a flake treatment process of the ribbon sheet 2 that is the subsequent process of the heat treatment.

In this case, when the heat treatment temperature is between 300° C. to 430° C. ($T_0$), the inductance is represented as about 20.7 µH, but the inductance at the time of performing the flake treatment process is reduced by 0.7 µH, and thus the inductance value is set to about 20 µH when being applied to the magnetic field shielding sheet 10.

Subsequently, a flake treatment process is performed with respect to one or two pieces of the heat treated amorphous ribbon sheets 2, at a state where a protective film 1 is attached on one side thereof, and a double-sided tape 3 attached with a release film 4 is attached on the other side thereof (S14).

In the case that the stacked amorphous ribbon sheets 2 are stacked in a two-layer form, the double-sided tape is inserted between the ribbon sheets 2, to thus enable mutual adhesion of the ribbon sheets 2.

Figure 7:
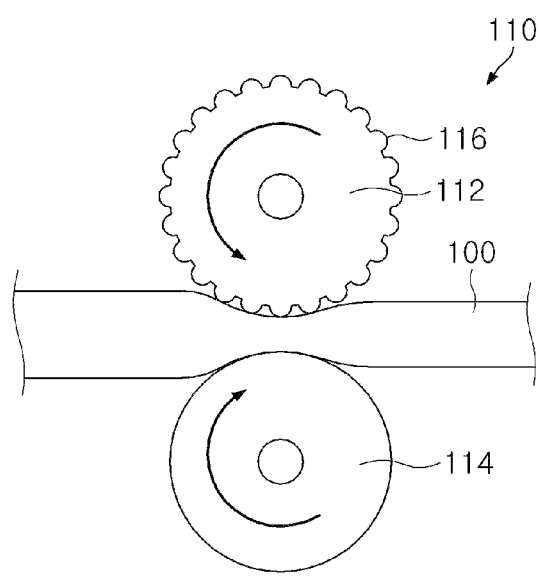
FIGS. 7 and 8 are cross-sectional views showing a flake treatment process of a laminate sheet according to the present invention, respectively.
Figure 8:
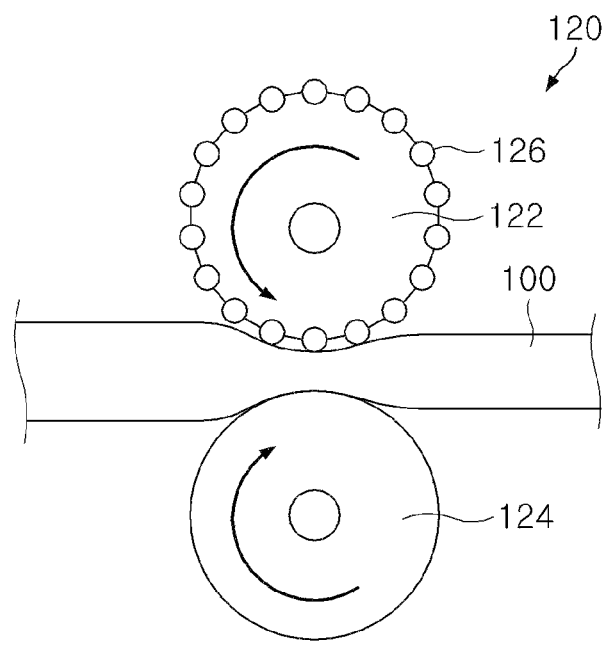

The flake treatment process is executed by allowing the laminate sheet 100 that is obtained by sequentially stacking, for example, the protective film 1, the amorphous ribbon sheet 2, the double-sided tape 3, and the release film 4, to pass through first and second flake devices 110 and 120 illustrated in FIGS. 7 and 8, to thereby separate the amorphous ribbon sheet 2 into a number of fine pieces 20. In this case, a plurality of the separated fine pieces 20 are maintained to keep a separated state by first and second adhesive layers 12 and 31 that are bonded to both sides of the amorphous ribbon sheet 2 as shown in FIG. 9.

For example, as shown in FIG. 7, an available first flake device 110 may consist of a metal roller 112 on the outer surface of which a plurality of irregularities 116 are formed, and a rubber roller 114 that is disposed in opposition to the metal roller 112. As shown in FIG. 8, a second flake device 120 may be composed of a metal roller 122 on the outer surface of which a plurality of spherical balls 126 are mounted, and a rubber roller 124 that is disposed in opposition to the metal roller 122.

Figure 9:
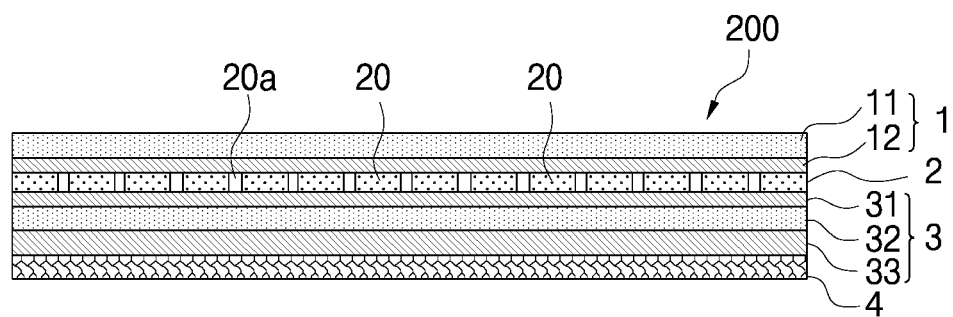
FIG. 9 is a cross-sectional view showing a state where a laminate sheet is flake-treated according to the present invention.

Thus, when the laminate sheet 100 is passed through the first and second flake devices 110 and 120, the amorphous ribbon sheet 2 is separated into a number of the fine pieces 20 and gaps 20a are formed between the fine pieces 20, as shown in FIG. 9.

Since the fine pieces 20 of the amorphous ribbon sheet 2 are formed to have a size of a range of several tens micrometers (µm) to 3 millimeters (mm), preferably, to have a size of a range of several hundred micrometers (µm) to 1 millimeter (mm), a demagnetizing field is made to increase to thereby remove a hysteresis loss and to thus heighten a uniformity of the permeability of the sheet.

Further, the flake treatment process of the amorphous ribbon sheet 2 may reduce the surface area of the fine pieces 20 and prevent a heat generation problem caused by an eddy current that is produced by an alternating-current magnetic field.

The flake treated laminate sheet 200 has the gaps 20a between the fine pieces 20. Thus, when the water is penetrated into the gaps 20a, the amorphous ribbon sheet is oxidized and the appearance of the amorphous ribbon is poor and the shielding performance is degraded somewhat.

Further, in the case that only a flake treatment process is performed, the fine pieces 20 are in contact with each other along the flow of the fine pieces 20, to accordingly increase the size of the fine pieces 20 and to thus cause a problem that the eddy-current loss increases.

Furthermore, the flake treated laminate sheet 200 may have non-uniformity caused on the surface of the sheet during performing the flake treatment process, and stabilization of the flake treated ribbon is needed.

Thus, the flake treated laminate sheet 200 undergoes a laminating process for flattening, slimming, and stabilization of the sheet 200, while simultaneously filling the adhesive into the gaps 20a of the fine pieces 20 (S15). As a result, water penetration is prevented, and at the same time all sides of the fine pieces 20 are surrounded by the adhesive, to thereby separate the fine pieces 20 from one another and reduce the eddy current.

Figure 10:
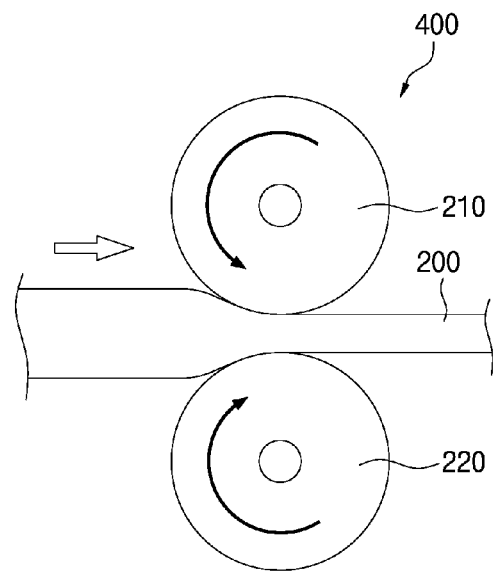
FIGS. 10 and 11 are cross-sectional views showing a laminating process of a flake-treated laminate sheet according to the present invention, respectively.
Figure 11:
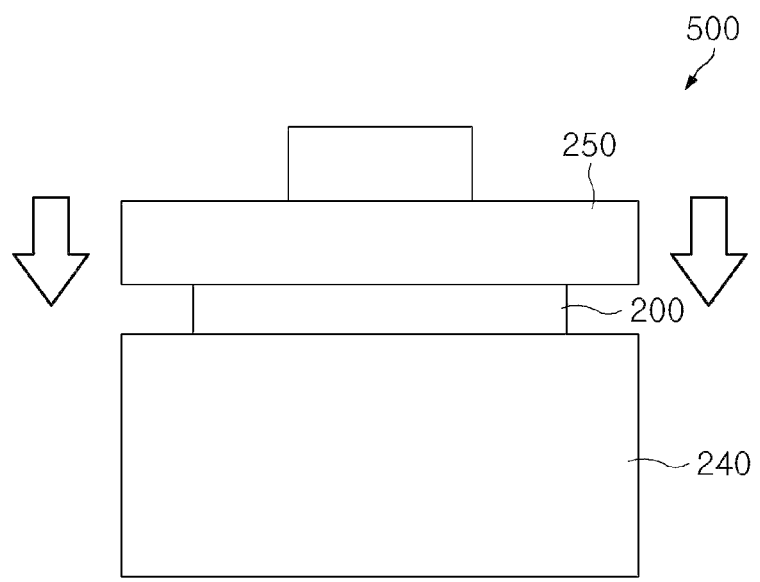

As shown in FIG. 10, a laminating device 400 for the laminating process may employ a roll press type including a first pressing roller 210 and a second pressing roller 220 that is disposed at a predetermined distance from the first pressing roller 210, between which the flake treated laminate sheet 200 passes. As shown in FIG. 11, a laminating device 500 for the laminating process may employ a hydraulic press type including a lower pressing member 240 and an upper pressing member 250 that is vertically movably disposed on the upper side of the lower pressing member 240.

When the flake treated laminate sheet 200 is heated at the room temperature or at a temperature of 50° C. to 80° C., and then is passed through the laminating device 400 or 500, a first adhesive layer 12 of the protective film 1 is pressed, while some of the adhesive of the first adhesive layer 12 are introduced into the gaps 20a to seal the gaps 20a. Simultaneously, the double-sided tape 3 is pressed, while some of the adhesive of the second adhesive layer 31 are introduced into the gaps 20a to seal the gaps 20a.

Here, the first adhesive layer 12 and the second adhesive layer 31 may be formed by using an adhesive that can be deformed at the time of being pressed at the room temperature, or may be formed by using a thermoplastic adhesive that can be thermally deformed by applied heat.

In addition, the first adhesive layer 12 and the second adhesive layer 31 preferably have a thickness of at least 50% when compared to the thickness of the amorphous ribbon so as to sufficiently fill the gaps 20a between the fine pieces 20.

Further, the interval between the first pressure roller 210 and the second pressure roller 220 and the interval between the upper pressing member 250 and the lower pressing member 240 when the upper pressing member 250 is in a lowered state, are preferably formed of a thickness of 50% or less when compared to the thickness of the laminate sheet 200, so that the adhesives of the first adhesive layer 12 and the second adhesive layer 31 can be introduced into the gaps 20a.

Any device of performing the pressing of the laminate sheets 100 and 200 and the flake treatment process thereof, can be used in the present invention.

Figure 12:
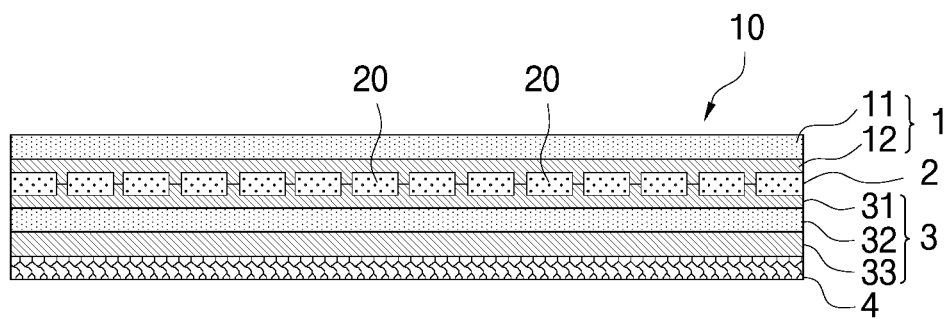
FIG. 12 is a cross-sectional view showing a state where a magnetic field shielding sheet according to a first embodiment of the present invention has been flake-treated and then laminated.

As shown in FIG. 12, when the laminating process is completed, a magnetic filed shielding sheet 10 according to the present invention may have a structure that the first adhesive layer 12 and the second adhesive layer 31 partially fill the gaps 20a between the fine pieces 20 at a state where the amorphous ribbon sheet 2 is separated into the fine pieces 20, to thereby prevent the oxidation and the flow of the amorphous ribbon sheet 2.

Finally, the magnetic field shielding sheet 10 having undergone the laminating process is stamped into a rectangular shape of the size corresponding to a digitizer 54 of FIG. 16 so as to be produced into products (S16).

In the embodiment, it has been described with respect to the case that a sheet of the protective film 1 is adhered to one side of the magnetic sheet 2 and then the flake treatment process and the laminating process are executed, but the protective film 1 may be damaged during the flake treatment process. Thus, preferably, a temporary protective film for protecting the protective film 1 is attached on top of the protective film 1 before performing a treatment process, and then the temporary protective film on the surface of the magnetic sheet 2 is peeled off and removed after completion of the treatment process.

Humidity Test

A humidity test was conducted for 120 hours at temperature of 85° C. and humidity of 85% with respect to the magnetic field shielding sheet 10 obtained in accordance with the invention and the laminate sheet 200 that has undergone the flake process but does not pass through the lamination process.

Figure 13A:
FIG. 13A is an enlarged photograph of a magnetic field shielding sheet that has not passed through a laminating process after having performed a flake treatment process, but has undergone a humidity test.
Figure 13B:
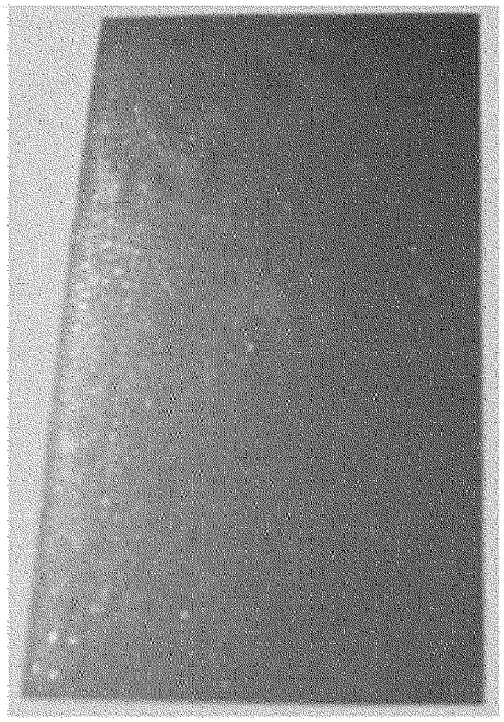
FIG. 13B is an enlarged photograph of a magnetic field shielding sheet that has passed through a laminating process after having performed a flake treatment process and has undergone a humidity test, according to the present invention.

As a result, as shown in FIG. 13A, in the case of the laminate sheet 200 where only the flake-treatment was processed, it can be seen that water was penetrated into the gaps between fine pieces when the amorphous ribbon was separated into a large number of fine pieces and then the amorphous ribbon was oxidized, and thus the appearance of the amorphous ribbon was changed. However, it can be seen that the magnetic field shielding sheet 10 in accordance with the present invention shows the appearance that does not change as shown in FIG. 13B.

Figure 14A:
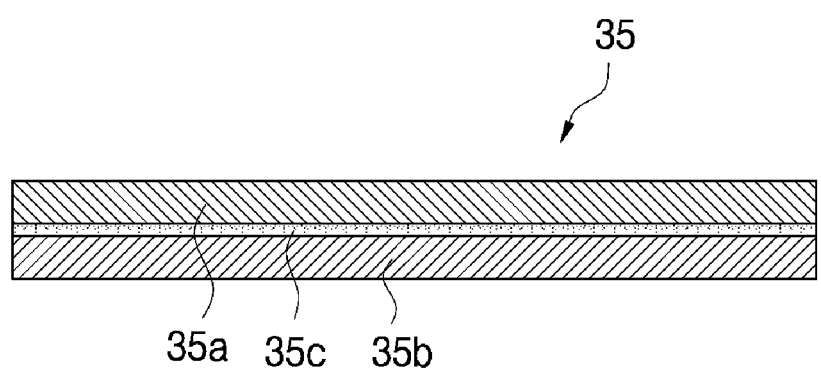
FIGS. 14A to 14C are a cross-sectional view, a plan view, and a perspective view showing a hybrid magnetic field shielding sheet that is configured by using different materials having different permeability according to a second example of the present invention.
Figure 14B:
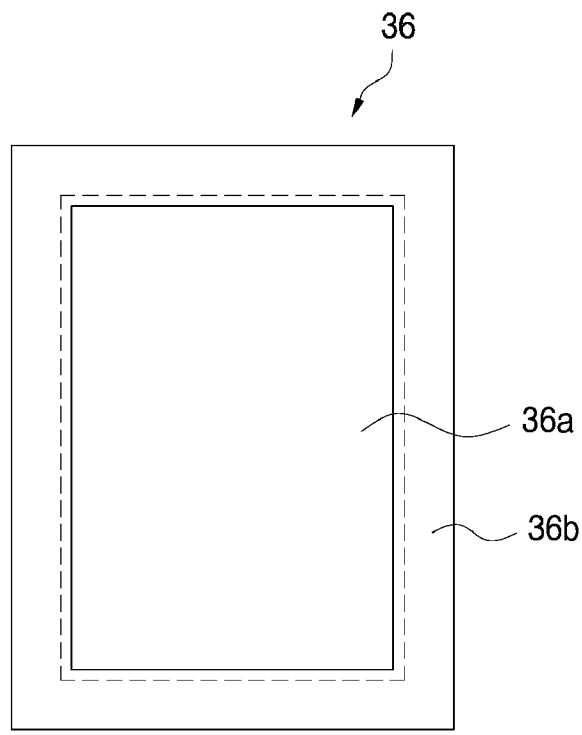
Figure 14C:
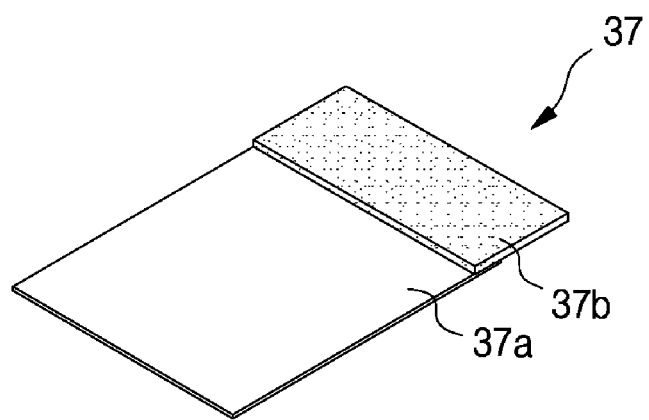

The magnetic field shielding sheet 10b of the single-layer or two-layer structure illustrated in FIGS. 1 and 2 according to the first embodiment of the present invention is configured by using the same amorphous ribbon sheet 2 as the magnetic sheet, but the magnetic field shielding sheet according to the present invention may be configured by using a hybrid type thin magnetic sheet made of different materials as in the case of the second embodiment of the present invention illustrated in FIGS. 14A to 14C.

As shown in FIG. 14A, a hybrid type thin film magnetic sheet 35 according to the second embodiment of the present invention can be configured in a hybrid form in which a bonding layer 35c is inserted and combined between a first magnetic sheet 35a of high permeability and a second magnetic sheet 35b of permeability lower than that of the first magnetic sheet 35a.

An amorphous ribbon sheet consisting of the above-described Fe-based amorphous alloy can be used as the first magnetic sheet 35a.

The second magnetic sheet 35b may be formed of a polymer sheet consisting of a magnetic powder of high permeability such as an amorphous alloy powder, soft magnetic powder, or a Sendust, and a resin.

In this case, the amorphous alloy powder has a composition selected from the group consisting of for example, Fe—Si—B, Fe—Si—B—Cu—Nb, Fe—Zr—B and Co—Fe—Si—B, and preferably is formed of an amorphous alloy powder comprising one or more amorphous alloys.

Further, the hybrid-type thin film magnetic sheet 36 may be formed by using a certain area of an amorphous ribbon sheet at the center of the hybrid-type thin film magnetic sheet 36, as a first magnetic sheet 36a, and by combining a second annular magnetic sheet 36b that surrounds the whole of the first magnetic sheet 36a on the outside of the first magnetic sheet 36a into a polymer sheet or a ferrite loop, as shown in FIG. 14B. That is, the polymer sheet or the ferrite having relatively smaller permeability than the amorphous ribbon sheet is formed in a loop form and is arranged in the outer block of the amorphous ribbon sheet. As a result, the present invention can shield the magnetic field applied to the digitizer, while minimizing an influence upon the geomagnetic sensor 60.

In addition, referring to FIG. 14C, the hybrid type thin magnetic sheet 37 according to the second embodiment of the present invention is configured by including first and the second magnetic sheets 37a and 37b of different areas. The first magnetic sheet 37a is formed of an amorphous ribbon sheet of a larger area than the second magnetic sheet 37b, and the second magnetic sheet 37b is formed of a magnetic sheet having higher permeability than the amorphous ribbon sheet on one side of the first magnetic sheet 37a, for example, a heatless treatment Fe-based amorphous sheet with a width of about 2-3 mm. That is, the first magnetic sheet 37a and the second magnetic sheet 37b are combined in a hybrid form, to thus form the hybrid type thin magnetic sheet 37.

In the case of forming the hybrid type thin magnetic sheet 37, the second magnetic sheet 37b may be overlapped with the first magnetic sheet 37a, or may be partially overlapped with the first magnetic sheet 37a and extended from one end of the first magnetic sheet 37a. Otherwise, the second magnetic sheet 37b may be extended on a flat plane from one end of the first magnetic sheet 37a. In the case that the magnetic field shielding sheet using the hybrid type thin magnetic sheet 37 is applied to the portable terminal device 50, the second magnetic sheet 37b consisting of the Fe-based amorphous sheet is mounted to be disposed at a remote place from the geomagnetic sensor 60 disposed in a main circuit board 57 of FIG. 16.

The second magnetic sheet 37b consisting of a high permeability Fe-based amorphous sheet is used in a range capable of minimizing an influence on the geomagnetic sensor 60, and the high permeability magnetic field shielding sheet plays a role of assisting to absorb electromagnetic waves required to perform the digitizer function, that is, improves sensitivity of the electronic pen by increasing a transfer rate of a magnetic flux.

Meanwhile, the hybrid type thin magnetic sheets 37 according to the third embodiment of the present invention shown in FIG. 14C employs the second magnetic sheet 37b having the higher permeability than the first magnetic sheet 37a. However, the second magnetic sheet 37b has the lower permeability than the first magnetic sheet 37a.

That is, the first magnetic sheet 37a is composed of a Fe-based amorphous ribbon sheet, and the second magnetic sheet 37b is composed of a polymer sheet. The second magnetic sheet 37b having low permeability is mounted to be disposed at a near place from the geomagnetic sensor 60 disposed in the main circuit board 57 of FIG. 16. As a result, the present invention can shield the magnetic field applied to the digitizer, while minimizing an influence upon the geomagnetic sensor 60.

Figure 15:
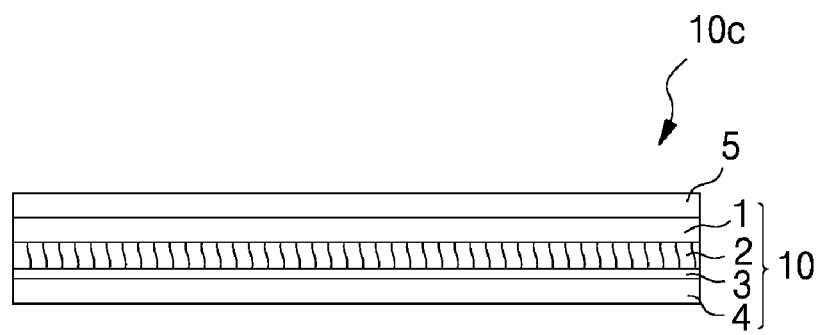
FIG. 15 is a cross-sectional view showing a magnetic field shielding sheet for a digitizer having an electromagnetic wave shielding function according to a third example of the present invention.

Meanwhile, FIG. 15 shows a shielding sheet having a function of shielding an electromagnetic wave according to a third embodiment of the present invention.

The shielding sheet 10c according to the third embodiment of the present invention has a structure that a conductive sheet 5 made of a Cu or Al foil having an excellent conductivity is bonded on one side of the magnetic field shielding sheet 10 according to the first embodiment of the present invention, by using a double-sided tape or adhesive, so as to provide an additional function of shielding the electromagnetic wave. It is suitable that the conductive sheet 5 has a thickness of 5 to 100 μm, preferably, a thickness of 10 to 20 μm.

Further, the conductive sheet 5 can be possibly formed of a thin film metal layer made of one selected from Cu, Ni, Ag, Al, Au, Sn, Zn, Mn or a combination thereof, by a sputtering method, other than the conductive sheet 5 made in the form of a foil.

The shielding sheet 10c having the function of shielding the electromagnetic wave, can be used to block an electromagnetic wave generated from a main body of a notebook computer such as a laptop computer from influencing a digitizer, in the case that a digitizer function is provided for the notebook computer from which the electromagnetic wave, for example, such as power source noise is severely generated.

In this case, the shielding sheet 10c according to the third embodiment of the present invention is attached to the back surface of a digitizer panel (PCB) throughout the double-sided tape 3 so that the conductor sheet 5 is exposed toward the main circuit board.

Meanwhile, a structure that the magnetic field shielding sheet according to the present invention is applied to a portable terminal device having a digitizer function will be described below with reference to FIG. 16.

FIG. 16 is a schematic exploded perspective view of the structure that a magnetic field shielding sheet according to the present invention is applied to a portable terminal device having a digitizer function.

Referring to FIG. 16, a portable terminal device 50 according to the present invention includes a touch screen panel 52, a display panel 53, a digitizer panel 54, a magnetic field shielding sheet 10, a bracket 56, a main circuit board 57, and a rear cover 58 that are sequentially engaged, and an electronic pen 51 that receives power from the portable terminal device 50 in a non-contact manner to then be activated.

The portable terminal device 50 includes an integrated touch panel 52 disposed on the whole surface of an LCD or AMOLED type display panel 53, on a top surface of the portable terminal device 50, in order to act as an interface between the portable terminal device 50 and a user. A touch screen panel, for example, may be implemented in an 'On-Cell' manner just above the AMOLED display in a deposition form.

In order to implement the portable terminal device 50 having a digitizer function, the electronic pen 51 is configured to have a coil-shaped antenna and circuit elements for wireless communications therein to send and receive information to and from the portable terminal device 50 via wireless communications, to thereby receive power in a non-contact manner to thus drive the circuit elements.

To this end, the electronic pen 51 receives an alternating-current (AC) magnetic field of a band of 100 to 200 kHz generated in the portable terminal device 50 so that power is wirelessly transmitted to the electronic pen 51, and thus the internal circuit elements are driven, by employing a wireless charging function, and performs wireless communications between the digitizer panel 54 and the electronic pen 51 by using frequencies above 500 kHz.

The digitizer function is implemented by the digitizer panel 54 disposed on the lower side of the touch screen panel 52 and the display panel 53. The digitizer panel 54 is formed of a thin metallic film. If electricity flows through the digitizer panel 54, the electromagnetic field is created. An ultra-miniature antenna coil for generating an alternating-current (AC) magnetic field is provided at the tip end portion of the electronic pen 51.

When the tip end portion of the electronic pen 51 is made to approach the touch screen panel 52, in the case of using the digitizer function, an electromagnetic induction phenomenon occurs while the electromagnetic field that has already been formed on the digitizer panel 54 disposed below the touch screen panel 52 and the display panel 53 is transformed. Such a transformation of the electromagnetic field is detected by a sensor (not shown) disposed on one side edge of the digitizer panel 54, to thus recognize X and Y coordinates and the behavior of the pen.

In order to use the digitizer function using the electromagnetic induction phenomenon, it is necessary to shield electromagnetic fields generated from various components of a main circuit board 56 from influencing upon the digitizer panel 54, and focus the electromagnetic wave to improve the sensitivity when the track of the electronic pen 51 is detected by the electromagnetic induction phenomenon of the wireless communication signal of 500 kHz transmitted from the electronic pen 51. For this purpose, a magnetic field shielding sheet 10 is inserted between the digitizer panel 54 and the main circuit board 57.

The magnetic field shielding sheet 10 can be in close contact with the rear surface of the digitizer panel 54, by using a double-sided tape, or can detachably coupled to the rear surface of the digitizer panel 54, by using a separate fixing bracket 56.

That is, in the case of a method of attaching the magnetic field shielding sheet 10, the release film 4 is removed from the magnetic field shielding sheet 10 and the double-sided tape 3 is attached on the rear surface of the digitizer panel 54.

Further, instead of a method of attaching the magnetic field shielding sheet 10, an alternative double-sided tape disposed on top of a protective film 1 of the magnetic field shielding sheet 10 is attached on the rear surface of the digitizer panel 54, and the release film 4 is removed from the lower portion of the magnetic field shielding sheet 10 and a finishing material (not shown) may be attached to an adhesive layer 33 of the double-sided tape 3 exposed from the lower portion of the magnetic field shielding sheet 10.

Meanwhile, for implementing functions such as navigation or augmented reality, the portable terminal device is provided with the geomagnetic sensor 60 disposed on one corner of the main circuit board 57.

The magnetic field shielding sheet 10 is made in size corresponding to the digitizer panel 54 so as not to affect the digitizer function. In this case, the magnetic field shielding sheet 10 is formed slightly smaller than the size of the main circuit board 57, and thus it is desirable to maintain spacing of at least 2 mm between the magnetic field shielding sheet 10 and the geomagnetic sensor 60 inside the portable terminal device.

The permeability (inductance) of the amorphous ribbon sheet 2 according to the present invention is set to be in a permeability range that does not affect the geomagnetic sensor 60, while shielding the magnetic field generated from the main body of the portable terminal device, that is, the main circuit board 57, so as not to be influenced upon the digitizer panel 54 and so as to achieve the improvement of the sensitivity of the digitizer.

As a result, even when the magnetic field shielding sheet 10 according to the invention is made to lie adjacent to the geomagnetic sensor 60 as described above, and to be used in the portable terminal device together with the geomagnetic sensor 60, an influence upon the geomagnetic sensor 60 is minimized.

In addition, the magnetic field shielding sheet 10 according to the present invention includes the Fe-based amorphous ribbon sheet 2 that has an amorphous tissue and is flake-treated to then be separated and/or cracked into a large number of fine pieces 20. As a result, the magnetic field shielding sheet 10 according to the present invention allows the amorphous ribbon sheet 2 to be flake-treated to then be separated and/or cracked into a large number of fine pieces 20, to thereby increase a demagnetizing field and thus remove a hysteresis loss, and to heighten uniformity of the permeability of the sheet and resultantly implement a digitizer of uniform characteristics.

Further, the amorphous ribbon sheet 2 is flake-treated to thereby reduce the surface area of the ribbon, and to thus block a heat generation problem due to the eddy currents generated by the alternating-current (AC) magnetic field.

Meanwhile, the magnetic field shielding sheet employed in the portable terminal device is built in the portable terminal device in order to shield a vertical magnetic field applied along the direction perpendicular to the magnetic field shielding sheet. However, the portable terminal device can be placed in a situation where a magnetic field that includes the geomagnetic field and is much higher than the geomagnetic field is applied from the side surfaces of the magnetic field shielding sheet.

When a magnetic field is applied from the outside along one side surface of a magnetic field shielding sheet in the case that the conventional heatless treated or the high permeability Fe-based amorphous ribbon sheet is applied as the magnetic field shielding sheet, the magnetic field passes through along the plane of the sheet and radiates toward the opposite side to the sheet to which the magnetic field has been input. As a result, the geomagnetic sensor 60 has a difference in the intensities of the sensitivities in X, Y, and Z directions, and causes a problem that an angular error occurs.

In contrast, since the Fe-based amorphous ribbon sheet 2 according to the present invention is separated and/or cracked into a large number of fine pieces 20 by a flake treatment process, even in the case that a magnetic field is applied from the outside along one side surface of the Fe-based amorphous ribbon sheet 2, the magnetic field is attenuated while passing through the fine pieces 20, and thus does not nearly radiate toward the opposite side to the sheet to which the magnetic field has been input.

As a result, when the magnetic field shielding sheet 10 having the amorphous ribbon sheet 2 according to the present invention is used in a portable terminal device 50, even in the case that a magnetic field is applied along one side surface of the magnetic field shielding sheet 2 from the outside, the geomagnetic sensor 60 is not nearly influenced by the magnetic field.

When using the magnetic field shielding sheet employing the Fe-based amorphous ribbon sheet 2 that has been flake-treated, according to the present invention, the geomagnetic sensor does not cause a hysteresis distortion problem but cause only distortions of azimuth and sensor sensitivity. These distortions can be solved via a correction, to thereby implement a distortion-free navigation function and improve sensitivity of the digitizer function.

In addition, as described above, in the case that the high permeability magnetic field shielding sheet 10 is included in the digitizer panel 54 of the portable terminal device 10, the high permeability magnetic field shielding sheet 10 blocks effects influencing upon the digitizer panel 54 due to the alternating-current (AC) magnetic field that is generated when the portable terminal device performs the wireless communications or additional functions such as NFC (Near Field Communications) or RFID (Radio Frequency Identification), and at the same time plays a role of assisting the magnetic field shielding sheet 10 to absorb electromagnetic waves required to perform a digitizer function, that is, increases a transfer rate of the magnetic flux, to thereby improve sensitivity of the electronic pen.

In the case that no geomagnetic sensor is employed in the portable terminal device, the Fe-based amorphous ribbon sheet that is used only for the purpose of shielding a magnetic field for a digitizer can enhance sensitivity of the digitizer as permeability (inductance) becomes high.

Hereinafter, embodiments of the present invention will be described in more detail. However, the following embodiments are nothing but illustrative of the present invention and the scope of the present invention is not limited thereto.

Comparative Example 1

Figure 17A:
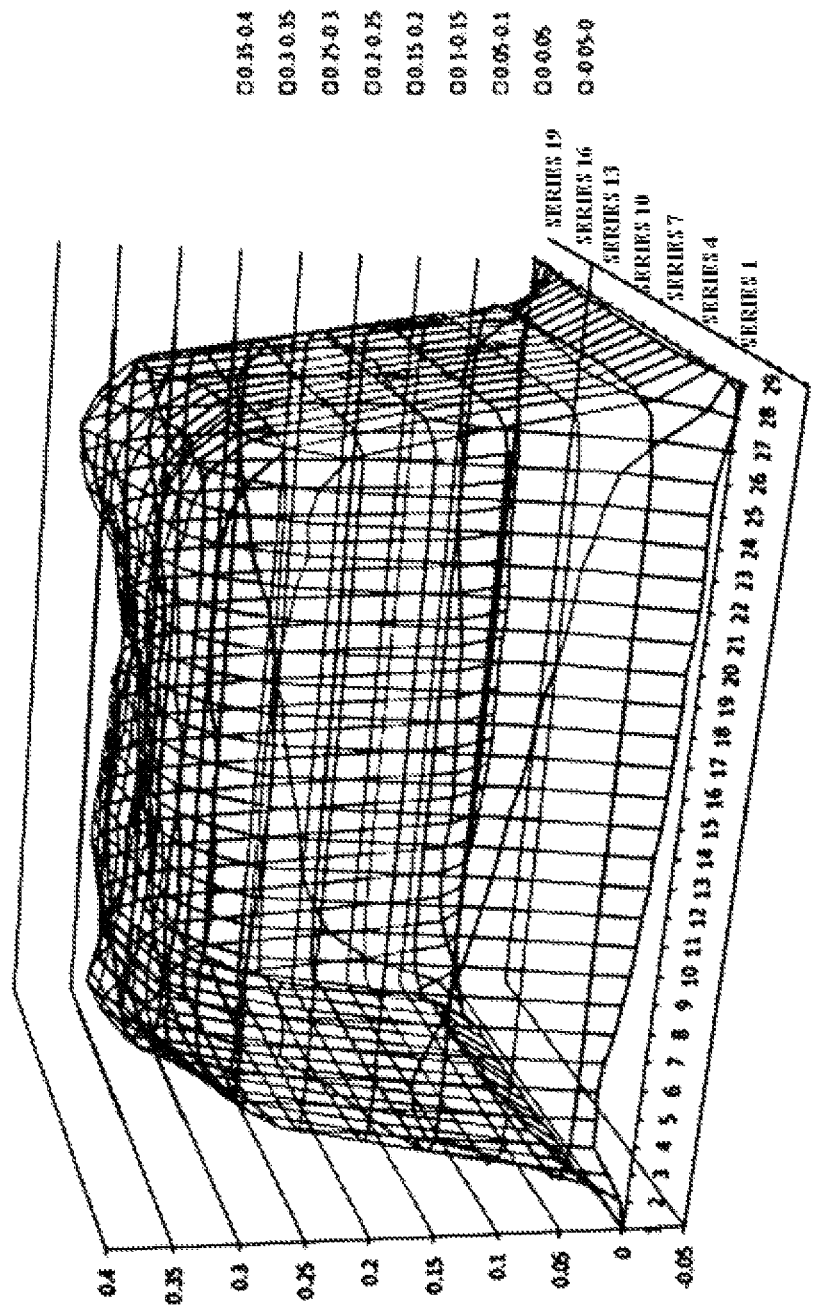
FIGS. 17A and 17B are graphs respectively showing a surface inductance distribution of a heatless treatment Fe-based amorphous ribbon sheet and that of a heat treated Fe-based amorphous ribbon sheet according to the present invention.

Characteristics of Inductance Distribution on the Surface of a Magnetic Field Shielding Sheet when a High Permeability Fe-Based Amorphous Ribbon Sheet is Used as the Magnetic Field Shielding Sheet In Comparative Example 1, a signal of 500 kHz that is a communication frequency of a digitizer is applied to a typical heatless treatment Fe-based amorphous ribbon sheet of 27 μm thick made of a Fe—Si—B alloy having an inductance value of 19.5 μH, under the condition of AC 1V in an LCR meter that is a piece of electronic test equipment used to measure the inductance (L), capacitance (C), and resistance (R) of a component, and thus the inductance values on the surface of the shielding sheet were measured by using a planar coil whose diameter is 34 mm, while having an inductance value of 12.1 µH, in which the measured results are shown in FIG. 17A.

Example 1

A Fe-based amorphous ribbon sheet of 27 µm thick made of a Fe—Si—B alloy was heat treated at 450° C. for 1.5 hours under no magnetic field. Then, the inductance values on the surface of the shielding sheet were measured by using the non-magnetically heat treated amorphous ribbon sheet, in the same manner as in Comparative Example 1, and the measured results are shown in FIG. 17B.

Figure 17B:
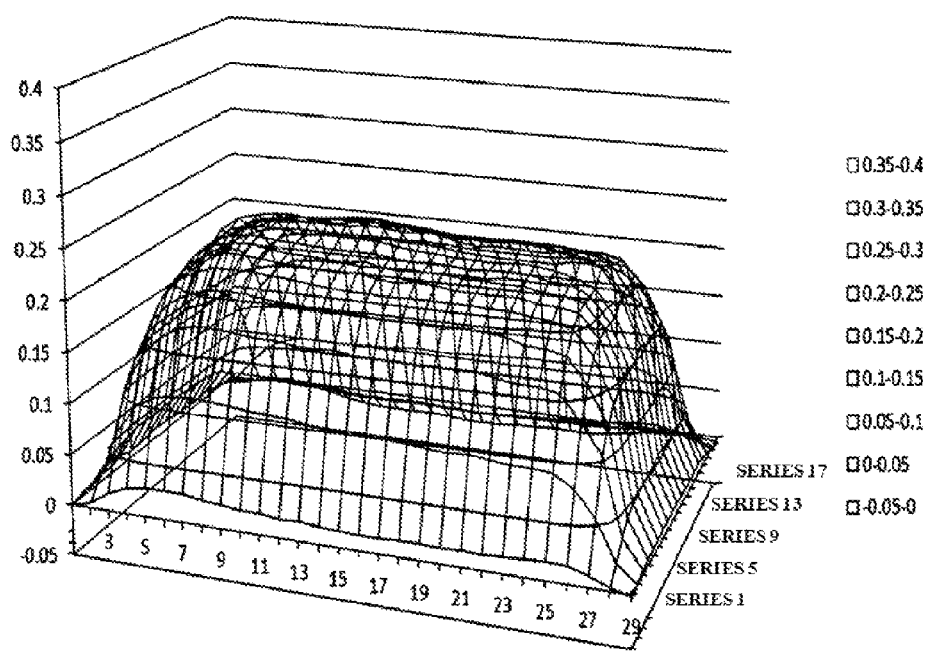

Referring to FIGS. 17A and 17B, it can be seen that the typical heatless treatment Fe-based amorphous ribbon sheet in Comparative Example 1 indicates an inductance distribution of a low flatness, but the Fe-based amorphous ribbon sheet in Example 1 indicates an inductance distribution of an excellent flatness.

In addition, the Fe-based amorphous ribbon sheet of Comparative Example 1 had a high inductance (permeability) of 19.5 µH, and thus made an influence upon the geomagnetic sensor when the Fe-based amorphous ribbon sheet was used as a magnetic field shielding sheet in a portable terminal device having a digitizer function, but the Fe-based amorphous ribbon sheet of Example 1 had a low inductance (permeability) of 16.5 µH due to the heat treatment and thus did not make an influence upon the geomagnetic sensor.

Furthermore, when the Fe-based amorphous ribbon sheet of Comparative Example 1 was used as the magnetic field shielding sheet in the portable terminal device having a digitizer function, an angular error of 160 degrees occurred in terms of the characteristics of the geomagnetic sensor, and thus the function as the geomagnetic sensor was lost. In addition, a great hysteresis phenomenon occurred according to the direction of rotation, an offset (that is a degree where a circle is beyond the origin point) was distorted by approximately 100% in the Y-axis direction due to the influence of the Fe-based amorphous ribbon sheet, and a sensitivity of the X-axis was also smaller by about 60% in comparison with the Y-axis, due to the influence of the magnetic hysteresis of the Fe-based amorphous ribbon sheet.

Comparative Example 2 and Example 2

After the Fe-based amorphous ribbon sheet of the Example 1 was heat-treated, a flake-treatment effect was examined while performing a flake treatment process of the heat-treated Fe-based amorphous ribbon sheet.

Figure 18A:
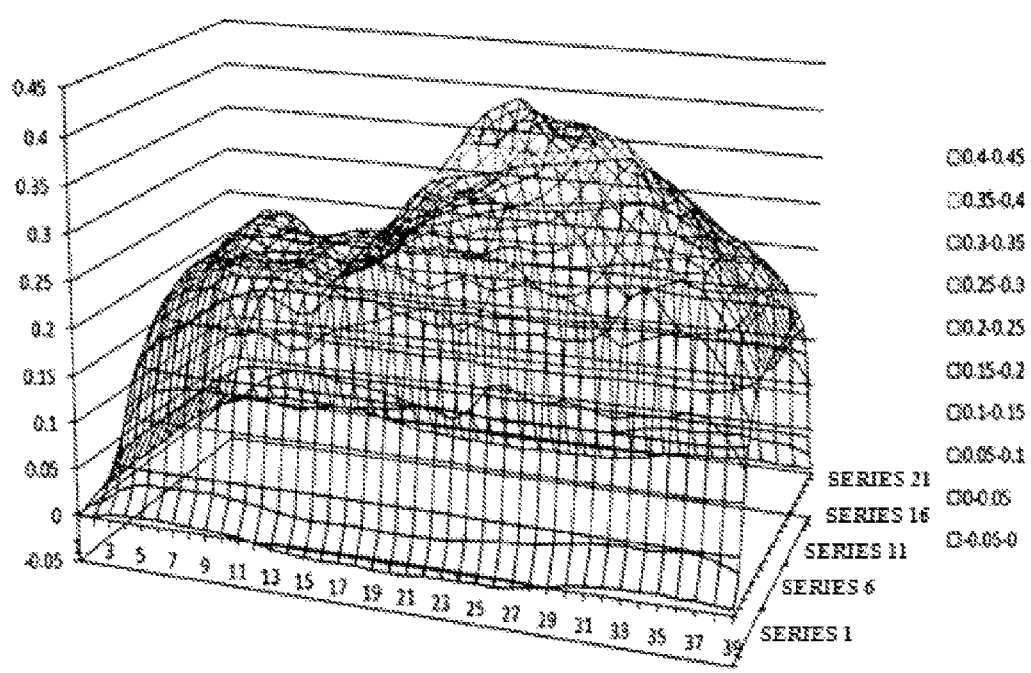
FIGS. 18A and 18B are graphs respectively showing a surface inductance distribution of a Fe-based amorphous ribbon sheet that is heat-treated but not flake-treated, and that of a Fe-based amorphous ribbon sheet that is heat-treated and flake-treated according to the present invention.
Figure 18B:
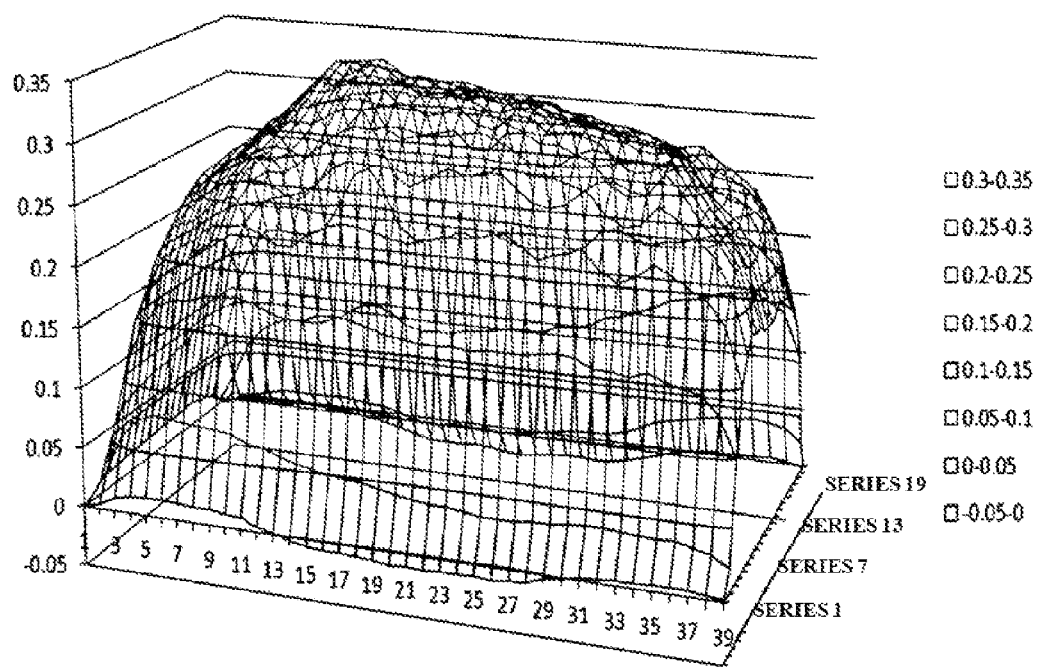

FIG. 18A is a graph showing an inductance distribution of a Fe-based amorphous ribbon sheet of Example 1 that is heat-treated but not flake-treated according to Comparative Example 2, in an identical manner to the above-described inductance distribution measuring method, and FIG. 18B is a graph showing an inductance distribution of a Fe-based amorphous ribbon sheet of Example 1 that is heat-treated and flake-treated according to Example 2, in an identical manner to the above-described inductance distribution measuring method.

When comparing the inductance distribution of the Comparative Example 2 illustrated in FIG. 18A with the inductance distribution of the Example 2 illustrated in FIG. 18B, it can be seen that the flatness of the inductance distribution was significantly improved when having performed the flake treatment process after having performed a heat treatment process.

As described above, when the flake treated Fe-based amorphous ribbon sheet having an optimized permeability according to the present invention is used as a magnetic field shielding sheet in a portable terminal device having a digitizer function, the uniformity of the inductance (i.e., permeability) of the sheet increases and thus a uniform digitizer function is given over a total area of the digitizer panel.

As described above, the present invention has been described with respect to particularly preferred embodiments. However, the present invention is not limited to the above embodiments, and it is possible for one who has an ordinary skill in the art to make various modifications and variations, without departing off the spirit of the present invention. Thus, the protective scope of the present invention is not defined within the detailed description thereof but is defined by the claims to be described later and the technical spirit of the present invention.

INDUSTRIAL APPLICABILITY

The present invention is applied in various portable electronic devices including a portable terminal device having a digitizer function, and blocks an effect of an electromagnetic field generated from various components of a main body of the portable terminal device and at the same time improves the uniform sensitivity of the digitizer function when the digitizer function is implemented in the portable terminal device, while minimizing an influence upon a geomagnetic sensor.

The invention claimed is:

1. A magnetic field shielding sheet for a digitizer, the magnetic field shielding sheet comprising:
   at least one layer thin magnetic sheet which is flake-treated so as to be separated into a plurality of fine pieces;
   a protective film that is adhered on one surface of the thin magnetic sheet via a first adhesive layer provided therebetween; and
   a double-sided adhesive tape that is adhered on the other surface of the thin magnetic sheet via a second adhesive layer provided therebetween,
   wherein the thin magnetic sheet is obtained by heat treating an amorphous ribbon sheet made of a Fe-based alloy at a temperature less than a crystallization temperature.

2. The magnetic field shielding sheet according to claim 1, wherein the amorphous ribbon sheet is heat treated in a temperature range of 300° C. to 480° C., preferably of 445° C. to 460° C.

3. The magnetic field shielding sheet according to claim 2, wherein an inductance value of the magnetic sheet is set to be in the range of 15 µH to 18 µH when a geomagnetic sensor is used together with the digitizer.

4. The magnetic field shielding sheet according to claim 1, wherein the amorphous ribbon sheet is formed in the range of 15 µm to 35 µm thick.

5. The magnetic field shielding sheet according to claim 1, wherein some of the first adhesive layer and the second adhesive layer are filled into the gaps between the fine pieces.

6. The magnetic field shielding sheet according to claim 1, wherein the fine pieces are formed of several tens of micrometers (µm) to 3 mm in size.

7. The magnetic field shielding sheet according to claim 1, wherein the thin magnetic sheet comprises:
   a Fe-based alloy ribbon sheet formed of the fine pieces;
   a polymer sheet that is stacked on the ribbon sheet and has a lower permeability than the ribbon sheet; and
   an adhesive layer that mutually bonds the ribbon sheet and the polymer sheet.

8. The magnetic field shielding sheet according to claim 1, further comprising an auxiliary magnetic sheet that is overlapped in an annular form on one side or an outer periphery of the thin magnetic sheet.

9. The magnetic field shielding sheet according to claim 1, further comprising a conductive sheet that is formed of a thin plate on an outer surface of the protective film to thus shield an electromagnetic wave.

10. A method of manufacturing a magnetic field shielding sheet for a digitizer, the method comprising the steps of:
heat treating a Fe-based amorphous alloy ribbon sheet made at a temperature of 300° C. to 480° C. for 30 minutes to 2 hours, to thereby form a thin magnetic sheet;
adhering a protective film and a double-sided tape formed of a release film on an exposed surface of the double-sided tape, respectively, on both sides of the thin magnetic sheet, to thereby form a laminate sheet;
performing a flake treatment process of the laminate sheet to thus separate the thin magnetic sheet into a plurality of fine pieces; and
laminating the flake treated laminate sheet,
wherein the laminate sheet is flattened and slimmed by lamination of the laminate sheet and some parts of first and second adhesive layers are filled into gaps among the plurality of fine pieces.

11. The method of claim 10, wherein the amorphous ribbon sheet is heat treated for 30 minutes to 2 hours in a heat treatment temperature range of 445° C. to 460° C.

12. The method of claim 11, wherein an inductance value of the ribbon sheet is set to be in the range of 15 μH to 18 μH.

13. The method of claim 10, wherein the fine pieces are formed of several tens of micrometers (μm) to 3 mm in size.

14. The method of claim 10, further comprising the step of bonding a Cu or Al foil on an outer surface of the protective film after the laminating step.

15. A portable terminal device having a first magnetic field shielding sheet that is inserted between a digitizer panel and a main circuit board and shields an alternating-current (AC) magnetic field generated from the main circuit board, the first magnetic field shielding sheet comprising:
at least one layer thin magnetic sheet which is flake-treated so as to be separated into a plurality of fine pieces;
a protective film that is adhered on one surface of the thin magnetic sheet via a first adhesive layer provided therebetween; and
a double-sided adhesive tape that is adhered on the other surface of the thin magnetic sheet via a second adhesive layer provided therebetween,
wherein the thin magnetic sheet is obtained by heat treating an amorphous ribbon sheet made of a Fe-based alloy at a temperature less than a crystallization temperature.

16. The portable terminal device according to claim 15, wherein the amorphous ribbon sheet is heat treated in a temperature range of 300° C. to 480° C., preferably of 445° C. to 460° C., and an inductance value of the ribbon sheet is set to be in the range of 15 μH to 18 μH.

17. The portable terminal device according to claim 15, further comprising a geomagnetic sensor that is disposed at one corner of the main circuit board, wherein the first magnetic field shielding sheet is made in a shape corresponding to a digitizer and that is mounted at an interval from the geomagnetic sensor.

18. The portable terminal device according to claim 15, further comprising a second magnetic field shielding sheet that has a permeability higher than that of the first magnetic field shielding sheet, that is overlapped from one side of the first magnetic field shielding sheet or extended from the first magnetic field shielding sheet while being partially overlapped with the first magnetic field shielding sheet, or that is extended in a flat form from the first magnetic field shielding sheet.

19. The portable terminal device according to claim 15, further comprising a second magnetic sheet that has a permeability different from that of the first thin magnetic sheet and that is stacked on one side of the thin magnetic sheet.

20. The portable terminal device according to claim 15, wherein the first magnetic field shielding sheet further comprises a conductive sheet that is formed of a thin plate on an outer surface of the protective film to thus shield an electromagnetic wave.

* * * * *